(12) United States Patent
Morimoto et al.

(10) Patent No.: US 11,158,755 B2
(45) Date of Patent: Oct. 26, 2021

(54) PHOTO-DETECTION APPARATUS AND PHOTO-DETECTION SYSTEM

(71) Applicant: CANON KABUSHIKI KAISHA, Tokyo (JP)

(72) Inventors: Kazuhiro Morimoto, Neuchâtel (CH); Mahito Shinohara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 169 days.

(21) Appl. No.: 16/656,230

(22) Filed: Oct. 17, 2019

(65) Prior Publication Data
US 2020/0052143 A1 Feb. 13, 2020

Related U.S. Application Data

(63) Continuation of application No. 15/721,492, filed on Sep. 29, 2017, now Pat. No. 10,497,822.

(30) Foreign Application Priority Data

Oct. 13, 2016 (JP) ............... JP2016-202052
Jul. 28, 2017 (JP) ............... JP2017-146724

(51) Int. Cl.
| | |
|---|---|
| *H01L 31/107* | (2006.01) |
| *H01L 27/144* | (2006.01) |
| *H01L 31/102* | (2006.01) |
| *H01L 31/0352* | (2006.01) |
| *B60W 30/00* | (2006.01) |

(Continued)

(52) U.S. Cl.
CPC ......... *H01L 31/107* (2013.01); *B60W 30/00* (2013.01); *G01S 7/4861* (2013.01); *G01S 17/10* (2013.01); *H01L 27/1446* (2013.01); *H01L 31/02005* (2013.01); *H01L 31/02027* (2013.01); *H01L 31/03529* (2013.01); *B60W 2420/40* (2013.01)

(58) Field of Classification Search
None
See application file for complete search history.

(56) References Cited

U.S. PATENT DOCUMENTS

| | | | |
|---|---|---|---|
| 6,392,282 B1 | 5/2002 | Sahara | |
| 9,209,336 B2 | 12/2015 | Sanfilippo | |

(Continued)

FOREIGN PATENT DOCUMENTS

| | | |
|---|---|---|
| CN | 103890972 A | 6/2014 |
| JP | 1146010 A | 2/1999 |

(Continued)

*Primary Examiner* — Todd Melton
(74) *Attorney, Agent, or Firm* — Canon U.S.A., Inc. IP Division

(57) ABSTRACT

An apparatus wherein, in plane view, a first semiconductor region of a first conductivity type overlaps at least a portion of a third semiconductor region, a second semiconductor region overlaps at least a portion of a fourth semiconductor region of a second conductivity type, a height of a potential of the third semiconductor region with respect to an electric charge of the first conductivity type is lower than that of the fourth semiconductor region, and a difference between a height of a potential of the first semiconductor region and that of the third semiconductor region is larger than a difference between a height of a potential of the second semiconductor region and that of the fourth semiconductor region.

23 Claims, 20 Drawing Sheets

(51) Int. Cl.
     *G01S 7/4861*     (2020.01)
     *G01S 17/10*      (2020.01)
     *H01L 31/02*      (2006.01)

(56) References Cited

U.S. PATENT DOCUMENTS

| | | |
|---|---|---|
| 10,475,831 B2 * | 11/2019 | Inoue ............... H01L 27/14636 |
| 2002/0139970 A1 | 10/2002 | Iwanczyk et al. |
| 2005/0258449 A1 | 11/2005 | Lutz et al. |
| 2012/0248562 A1 | 10/2012 | Pierschel |
| 2015/0054111 A1 | 2/2015 | Niclass |

FOREIGN PATENT DOCUMENTS

| | | |
|---|---|---|
| JP | 2006-179828 A | 7/2006 |
| JP | 2015-41746 A | 3/2015 |
| JP | 2018-64086 A | 4/2018 |
| RU | 2240631 C1 | 11/2004 |

* cited by examiner

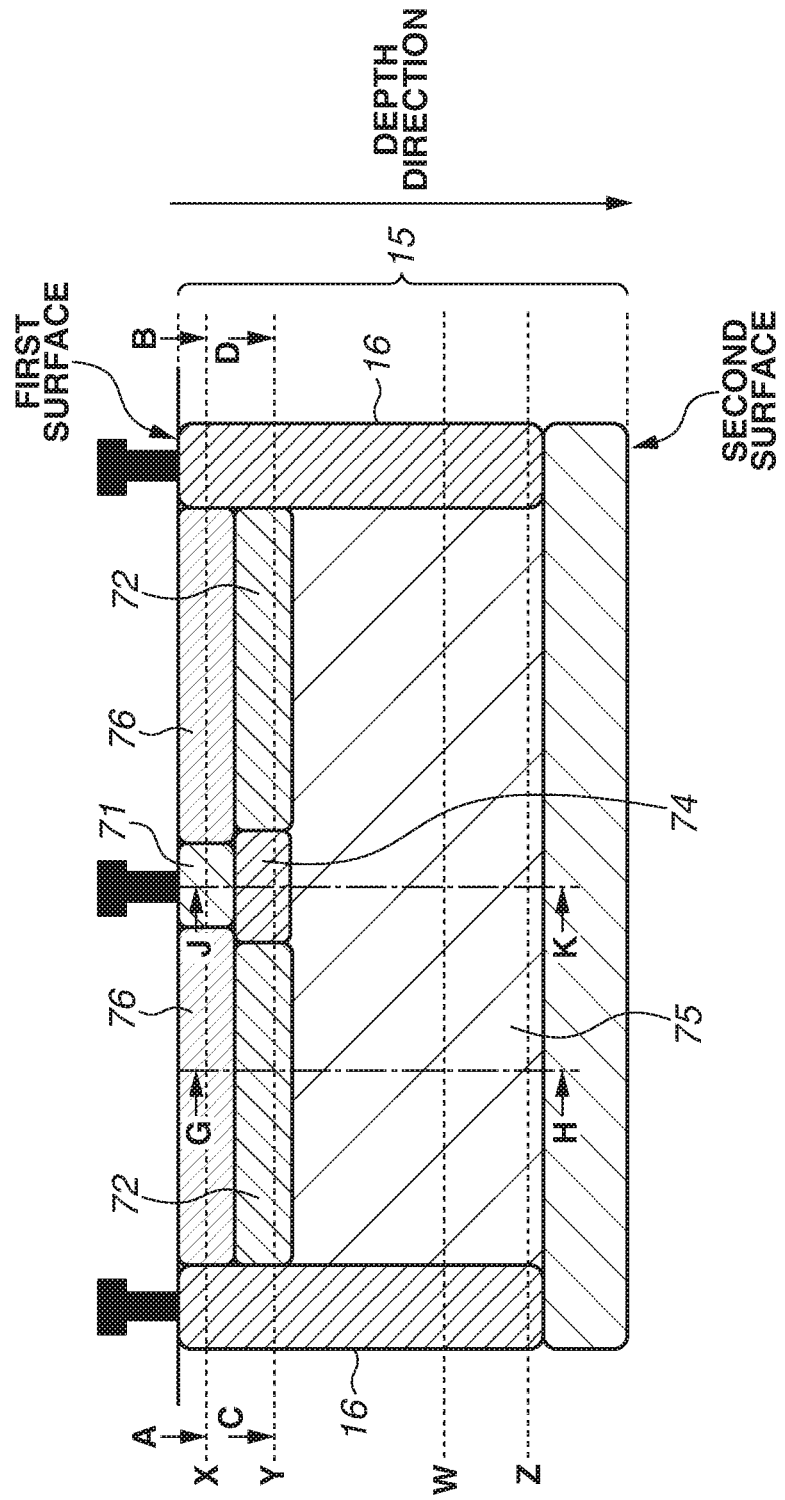

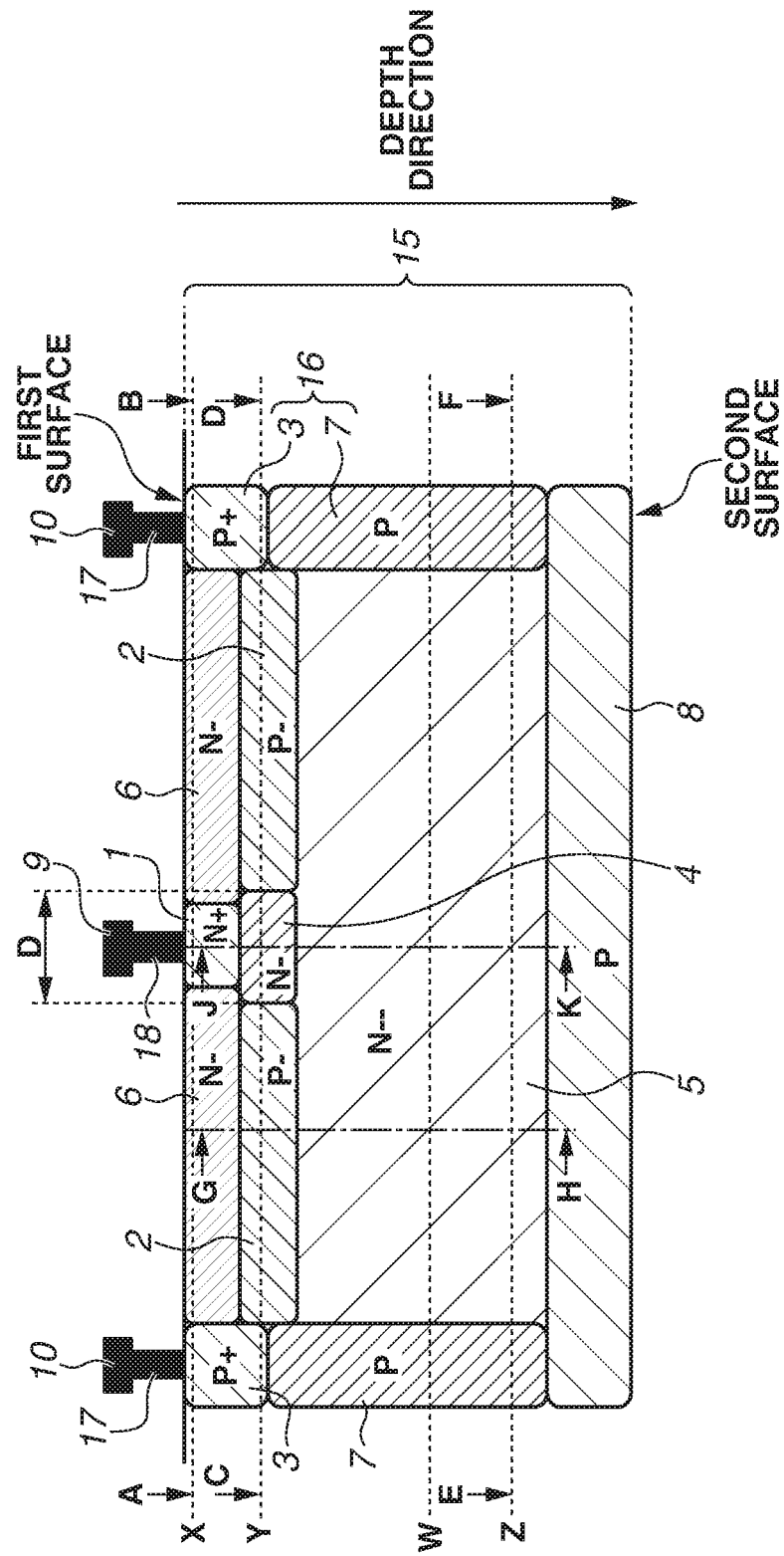

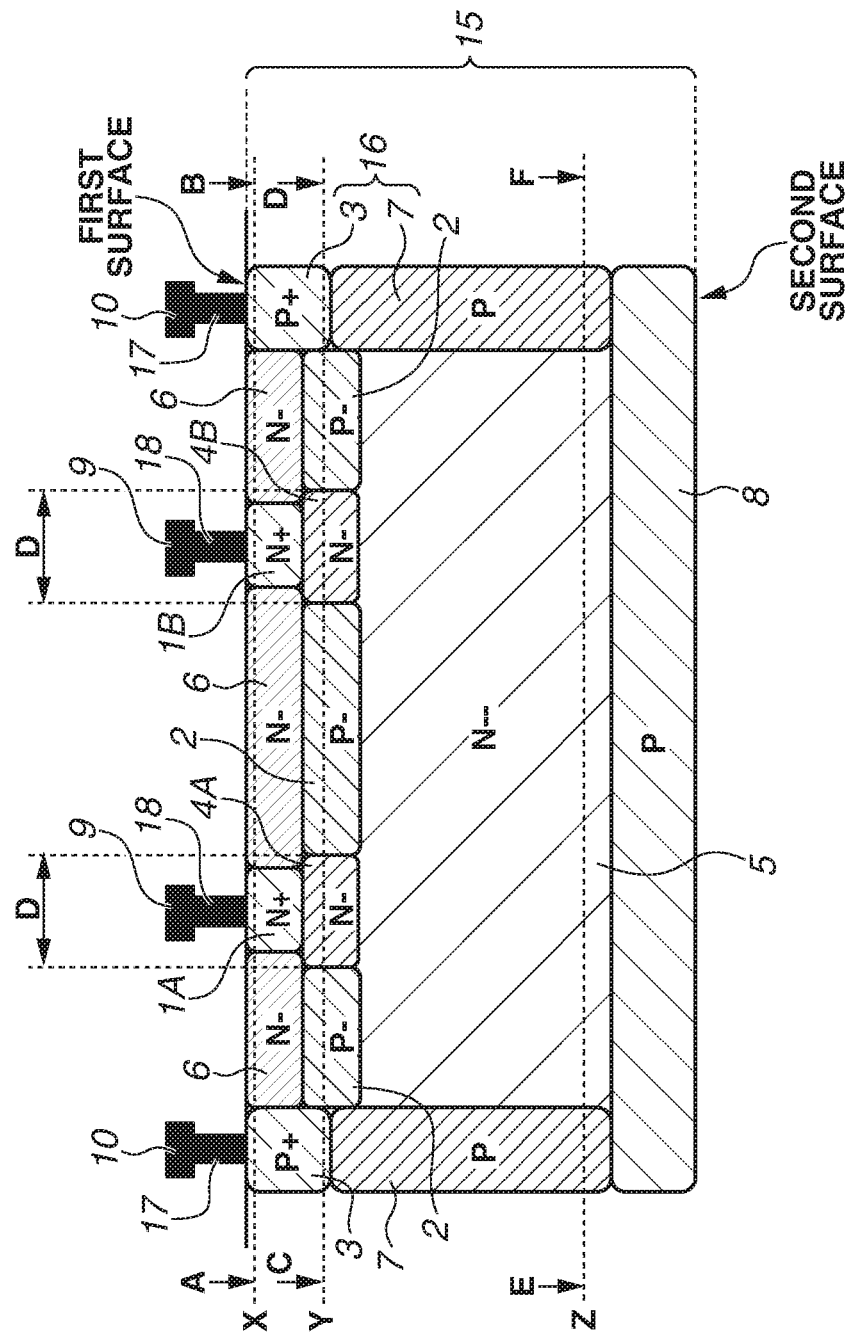

PHOTO-DETECTION APPARATUS AND PHOTO-DETECTION SYSTEM

CROSS-REFERENCE TO RELATED APPLICATIONS

This application is a continuation, and claims the benefit, of U.S. patent application Ser. No. 15/721,492, presently pending and filed on Sep. 29, 2017, and claims the benefit of, and priority to, Japanese Patent Application No. 2016-202052 filed Oct. 13, 2016, and Japanese Patent Application No. 2017-146724 filed Jul. 28, 2017 which applications are hereby incorporated by reference herein in their entireties.

BACKGROUND OF THE INVENTION

Field of the Invention

The aspect of the embodiments relates to a photo-detection apparatus and a photo-detection system that perform photoelectric conversion.

Description of the Related Art

A photo-detection apparatus capable of detecting feeble light at a single photon level by using avalanche (electron avalanche) doubling has been conventionally known.

In the specification of U.S. Pat. No. 9,209,336, a single photon avalanche diode (SPAD) in which a photocarrier originating from a single photon causes avalanche amplification in a PN junction region of a semiconductor region constituting a photoelectric converter is discussed.

In the SPAD discussed in the specification of U.S. Pat. No. 9,209,336, a P-type semiconductor region of a high impurity concentration is arranged on the surface of a semiconductor substrate and an N-type semiconductor region is arranged below the P-type semiconductor region. The N-type semiconductor region is arranged to be included in an N-type epitaxial layer. The P-type semiconductor region and the N-type semiconductor region constitute a PN junction and a high reverse bias voltage is applied to the PN junction.

In the SPAD discussed in the specification of U.S. Pat. No. 9,209,336, the region where an electric charge is detected is a PN junction region. A strong electric field is generated in the region where an electric charge is detected and thus, there is a possibility of a tunnel effect being produced in the PN junction by the strong electric field. An electric charge generated by the tunnel effect may become noise by being detected as a pseudo signal in the region where an electric charge is detected. The electric charge generated by the tunnel effect increases in proportion to the area of the region where an electric charge is detected.

On the other hand, if the area of the region where an electric charge is detected is decreased, an electric charge generated by the tunnel effect can be suppressed. However, if the area of the region where an electric charge is detected is decreased, there is a possibility of lowering photo-detection efficiency.

SUMMARY OF THE INVENTION

According to an aspect of the embodiments, an apparatus includes a semiconductor substrate having a first surface and a second surface opposed to the first surface, and a pixel unit having a plurality of pixels including an avalanche diode arranged on the semiconductor substrate, wherein the avalanche diode includes a first semiconductor region of a first conductivity type arranged in a first depth, a second semiconductor region arranged in contact with the first semiconductor region, a third semiconductor region arranged in a second depth deeper than the first depth with respect to the first surface, a fourth semiconductor region of a second conductivity type that is an opposite conductivity type of the first conductivity type, arranged in contact with the third semiconductor region, and a fifth semiconductor region arranged in a third depth deeper than the second depth with respect to the first surface, and wherein, in plane view, the first semiconductor region overlaps at least a portion of the third semiconductor region, the second semiconductor region overlaps at least a portion of the fourth semiconductor region, and the third semiconductor region and the fourth semiconductor region overlap the fifth semiconductor region, a height of a potential of the third semiconductor region with respect to an electric charge of the first conductivity type is lower than a height of a potential of the fourth semiconductor region with respect to the electric charge of the first conductivity type, and a difference between a height of a potential of the first semiconductor region with respect to the electric charge of the first conductivity type and the height of the potential of the third semiconductor region with respect to the electric charge of the first conductivity type is larger than a difference between a height of a potential of the second semiconductor region with respect to the electric charge of the first conductivity type and the height of the potential of the fourth semiconductor region with respect to the electric charge of the first conductivity type.

Further features of the disclosure will become apparent from the following description of exemplary embodiments with reference to the attached drawings.

BRIEF DESCRIPTION OF THE DRAWINGS

FIG. 1 is a schematic sectional view of an avalanche diode.

FIG. 6 is a schematic sectional view of the avalanche diode.

FIG. 14 is a schematic sectional view of the avalanche diode.

DESCRIPTION OF THE EMBODIMENTS

Figure 2A:
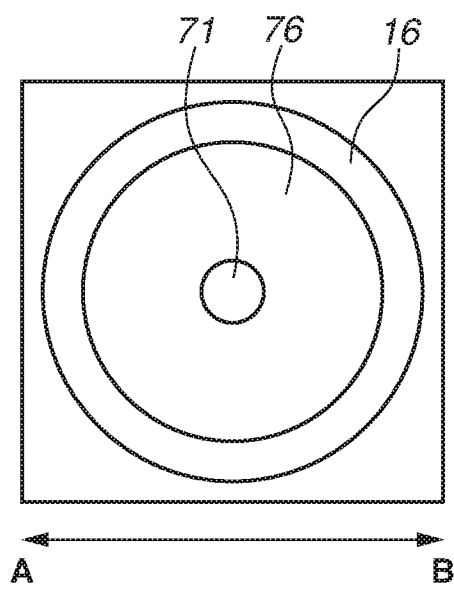
FIGS. 2A and 2B are schematic plan views of the avalanche diode.

Various exemplary embodiments, features, and aspects of the disclosure will be described in detail below with reference to the drawings.

A photo-detection apparatus according to an exemplary embodiment will be described with reference to FIGS. 1 to 3. The photo-detection apparatus according to the present exemplary embodiment has a pixel including an avalanche diode. The conductivity type of an electric charge used as a signal charge of a pair of electric charges generated in the avalanche diode is called a first conductivity type. The opposite conductivity type of the first conductivity type is called a second conductivity type.

FIG. 1 is a schematic sectional view of an avalanche diode according to the present exemplary embodiment. The avalanche diode in the present exemplary embodiment is arranged in a semiconductor substrate 15. The semiconductor substrate 15 has a first surface and a second surface opposite to the first surface. For example, the first surface is the front side of the semiconductor substrate 15 and the second surface is the backside of the semiconductor substrate 15. In the present exemplary embodiment, the depth direction is defined as a direction from the first surface toward the second surface. A gate electrode of a transistor and a multilayer interconnection structure are arranged on the front side of the semiconductor substrate 15.

In FIG. 1, a first semiconductor region 71 of the first conductivity type, a second semiconductor region 76, a third semiconductor region 74, a fourth semiconductor region 72 of the second conductivity type, and a fifth semiconductor region 75 are arranged in a region surrounded by an isolation portion 16.

The first semiconductor region 71 and the second semiconductor region 76 are arranged in a first depth X. The first semiconductor region 71 and the second semiconductor region 76 are in contact. The second semiconductor region 76 is arranged between the first semiconductor region 71 and the isolation portion 16. Here, the first semiconductor region 71 and the second semiconductor region 76 being arranged in the first depth X means that, for example, the region of the highest implanted impurity concentration (peak) is arranged in the first depth X. However, the peak does not necessarily need to be arranged in the first depth X and design errors or manufacturing errors are allowed.

The third semiconductor region 74 and the fourth semiconductor region 72 are arranged in a second depth Y deeper than the first depth X with respect to the first surface. The third semiconductor region 74 and the fourth semiconductor region 72 are in contact.

The first semiconductor region 71 overlaps at least a portion of the third semiconductor region 74 and the second semiconductor region 76 overlaps at least a portion of the fourth semiconductor region 72. The fourth semiconductor region 72 is arranged between the third semiconductor region 74 and the isolation portion 16.

The fifth semiconductor region 75 is arranged in a third depth Z deeper than the second depth Y with respect to the first surface. The third semiconductor region 74 and the fourth semiconductor region 72 overlap the fifth semiconductor region 75.

Figure 2B:
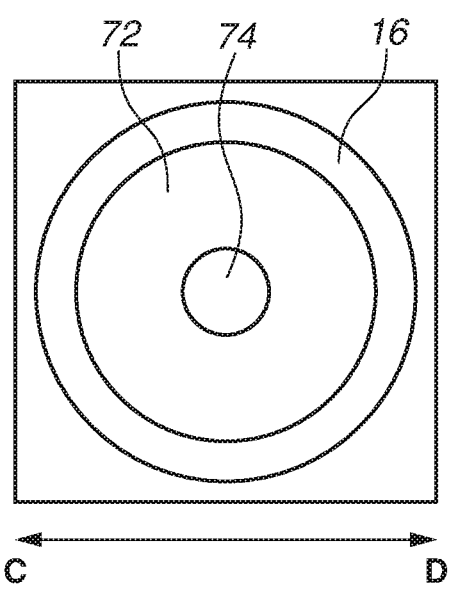

FIGS. 2A and 2B are schematic plan views. FIG. 2A illustrates a schematic plan view in the first depth X and FIG. 2B illustrates a schematic plan view in the second depth Y.

As illustrated in FIG. 2A, the first semiconductor region 71 is included in the second semiconductor region 76 in the first depth X. The second semiconductor region 76 is included in the isolation portion 16.

As illustrated in FIG. 2B, the third semiconductor region 74 is included in the fourth semiconductor region 72 in the second depth Y. The fourth semiconductor region 72 is included in the isolation portion 16. As is evident from FIGS. 1 to 2B, the first semiconductor region 71 overlaps at least a portion of the third semiconductor region 74, and the third semiconductor region 74 and the fourth semiconductor region 72 overlap the fifth semiconductor region 75 in plane view. Further, the second semiconductor region 76 overlaps at least a portion of the fourth semiconductor region 72.

Figure 3:
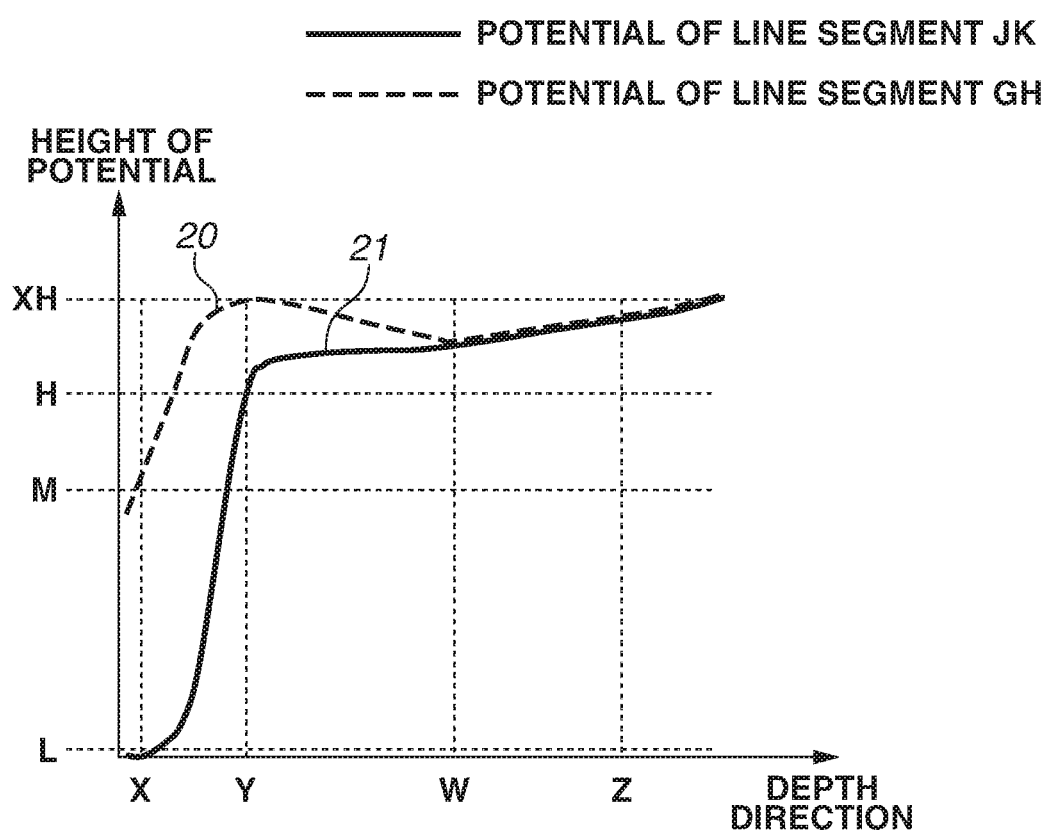
FIG. 3 is a potential chart of the avalanche diode.

FIG. 3 illustrates a potential chart of the avalanche diode. FIG. 3 illustrates an example of potential distributions of a line segment JK and a line segment GH of the sectional view illustrated in FIG. 1. A dotted line 20 illustrates the potential distribution of the line segment GH and a solid line 21 illustrates the potential distribution of the line segment JK. Here, the potential viewed from electrons as a signal charge is illustrated. If the signal charge is made up of holes, the relation of the levels of the potential is reversed.

Furthermore, in FIG. 3, depths X, Y, Z and W correspond to each depth illustrated in FIG. 1 and the depth W is any depth between the depth Y and the depth Z.

The level of potential of an XH level illustrates the level of potential of the fourth semiconductor region 72. The level of potential of an H level illustrates the level of potential of the third semiconductor region 74. The level of potential of an M level illustrates the level of potential of the second semiconductor region 76. The level of potential of an L level illustrates the level of potential of the first semiconductor region 71. Here, the level of potential of the second semiconductor region 76 is assumed to be lower than that of the third semiconductor region 74, but the relation may be reversed.

The dotted line 20 illustrates the level of potential between the XH level and the H level in the depth Z. As the depth approaches the depth W from the depth Z, the potential gradually falls. Then, as the depth approaches the depth Y from the depth W, the potential gradually rises to reach the XH level in the depth Y. As the depth approaches the depth X from the depth Y, the potential gradually falls. The potential of the M level is reached in the depth X.

The solid line 21 illustrates the level of potential between the XH level and the H level in the depth Z. The potential gradually falls before the depth approaches the depth Y from the depth Z. When the depth approaches the depth Y, the level of potential starts to fall steeply to reach the level of potential of the H level in the depth Y. The level of potential steeply falls before the depth approaches the depth X from the depth Y. Then, the level of potential reaches the L level in the depth X.

The potentials of the dotted line 20 and the solid line 21 have almost the same level in the depth Z and have a potential gradient falling gradually toward the side of the first surface of the semiconductor substrate 15 in the region indicated by the line segment GH and the line segment JK. Thus, an electric charge generated in the photo-detection apparatus moves to the side of the first surface due to the gradual potential gradient.

As the depth approaches the depth Y from the depth W, the solid line 21 has a gradually falling potential gradient and an electric charge moves to the side of the first surface. On the other hand, the dotted line 20 forms a potential gradient acting as a potential barrier to an electric charge moving toward the first surface. The potential barrier (fourth semiconductor region 72) inhibits an electric charge from moving from the fifth semiconductor region 75 to the second semiconductor region 76. Because the potential in the direction to move from the line segment GH to the line segment JK is lower than the potential barrier, from the depth W to the depth Y, an electric charge present on the line segment GH can easily move to the neighborhood of the line segment JK in the course of moving toward the first surface.

An electric charge having moved to the neighborhood of the region indicated by the line segment JK is accelerated by a steep potential gradient, that is, a strong electric field from the depth Y to the depth X and the accelerated electric charge reaches the first semiconductor region 71. Avalanche amplification is generated in the region from the depth Y to the depth X. In the region indicated by the line segment GH, by contrast, the potential distribution is such that an avalanche breakdown is not generated or an avalanche breakdown is less likely to be generated than in the region indicated by the line segment JK or particularly the region from the depth Y to the depth X of the line segment JK. As an example of implementing such a structure, it is to adopt a structure in which the difference between the level of potential of the first semiconductor region 71 and that of the third semiconductor region 74 is larger than the difference between the level of potential of the second semiconductor region 76 and that of the fourth semiconductor region 72.

By adopting such a potential structure, when compared with a conventional configuration in which an avalanche breakdown occurs throughout the avalanche diode, a noise charge generated by the above tunnel effect can be reduced. In addition, according to the avalanche diode in the present exemplary embodiment, deterioration of sensitivity is not caused. This is because the potential structure is such that a signal charge present in a region of the fifth semiconductor region 75 overlapping the fourth semiconductor region 72 can easily move to the first semiconductor region via the third semiconductor region 74.

More specifically, this is because the level of potential of the third semiconductor region 74 is lower than that of the fourth semiconductor region 72. That is, the fourth semiconductor region 72 functions as a potential barrier to a signal charge present in the fifth semiconductor region 75 and, as a result, the electric charge can easily move to the first semiconductor region 71 via the third semiconductor region 74.

In FIG. 3, the potential structure when the third semiconductor region 74 is a P-type semiconductor region is illustrated, but if the third semiconductor region 74 is an N-type semiconductor region, the dotted line 20 is still higher than the solid line 21 at the position Y as the level of potential. Also, the potential structure when the second semiconductor region 76 is an N-type semiconductor region is illustrated, but if the second semiconductor region 76 is a P-type semiconductor region, the dotted line 20 is still higher than the solid line 21 at the position Y as the level of potential.

Incidentally, the entire region of the first semiconductor region 71 in plane view overlaps the third semiconductor region 74. According to such a configuration, the first semiconductor region 71 and the fourth semiconductor region 72 do not form a PN junction. Thus, avalanche amplification is generated in a PN junction between the first semiconductor region 71 and the fourth semiconductor region 72 so that noise due to the tunnel effect can be inhibited from being produced.

Hereinafter, exemplary embodiments of the disclosure will be described with specific exemplary embodiments. In each exemplary embodiment, a configuration in which a signal charge is made up of electrons is described, but each exemplary embodiment is applicable even if a signal charge is made up of holes. In such a case, however, the relation between each semiconductor region and the potential is reversed.

A first exemplary embodiment of a photo-detection apparatus to which the disclosure is applicable will be described with reference to FIGS. 4 to 9B. Also, similar reference signs are attached to units having similar functions to those in FIGS. 1 to 3, and a detailed description thereof is omitted.

Figure 4:
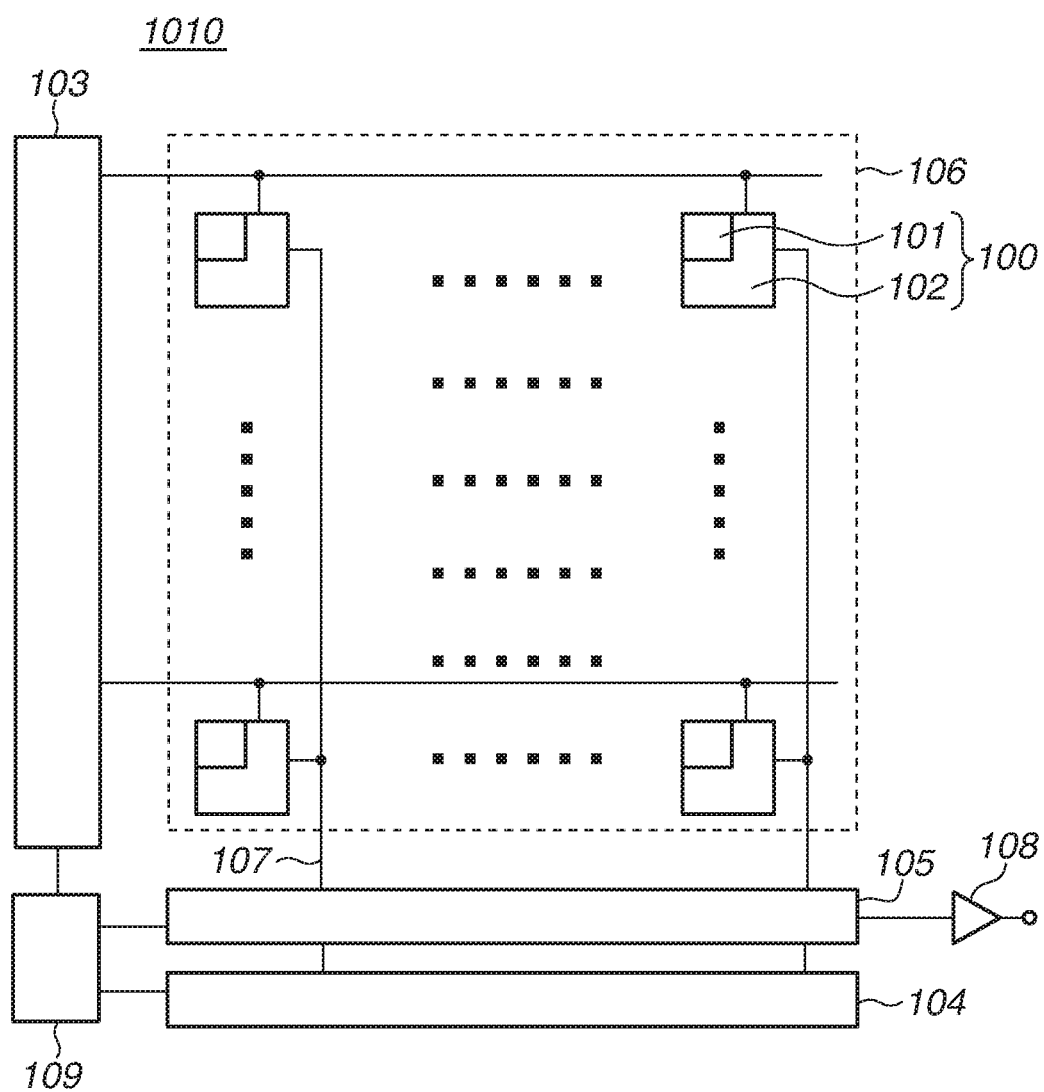
FIG. 4 is a block diagram of a photo-detection apparatus.

FIG. 4 is a block diagram of a photo-detection apparatus 1010 of a first exemplary embodiment. The photo-detection apparatus 1010 includes a pixel unit 106, a control pulse generation unit 109, a horizontal scanning circuit unit 104, a column circuit 105, a signal line 107, and a vertical scanning circuit unit 103.

A plurality of pixels 100 is arranged in a matrix shape in the pixel unit 106. One pixel 100 includes a photoelectric conversion element 101 and a pixel signal processing unit 102. The photoelectric conversion element 101 converts light into an electric signal. The pixel signal processing unit 102 outputs a converted electric signal to the column circuit 105.

The vertical scanning circuit unit 103 receives a control pulse supplied from the control pulse generation unit 109 to supply the control pulse to each of the pixels 100. A logic circuit such as a shift register or an address decoder is used as the vertical scanning circuit unit 103.

The signal line 107 supplies a signal output from the pixel 100 selected by the vertical scanning circuit unit 103 to the following circuit of the pixel 100 as a potential signal.

A signal of each of the pixels 100 is input into the column circuit 105 via the signal line 107 to perform predetermined processing. The predetermined processing includes noise removal and amplification of the input signal and conversion into a form for output outside the sensor. For example, the column circuit includes a parallel-serial conversion circuit.

The horizontal scanning circuit unit 104 supplies, to the column circuit 105, a control pulse to sequentially output signals after being processed by the column circuit 105 to an output circuit 108.

The output circuit 108 includes a buffer amplifier, a differential amplifier and the like and outputs a signal output from the column circuit 105 to a recording unit or a signal processing unit outside the photo-detection apparatus 1010.

In FIG. 4, the pixels 100 may be arranged one-dimensionally in the pixel unit 106 or the pixel unit 106 may include only a single pixel. Furthermore, a plurality of pixel columns may be divided into blocks to arrange the vertical scanning circuit unit 103, the horizontal scanning circuit unit 104, the column circuit 105, and the pixel unit 106 in each block. Also, the vertical scanning circuit unit 103, the horizontal scanning circuit unit 104, the column circuit 105, and the pixel unit 106 may be arranged in each pixel column.

The function of the pixel signal processing unit 102 does not necessarily need to be provided to each of all the pixels 100 and, for example, one pixel signal processing unit 102 may be shared by a plurality of the pixels 100 to sequentially perform signal processing. To increase the aperture ratio of the photoelectric conversion element 101, the pixel signal processing unit 102 may be provided on a different semiconductor substrate from that of the photoelectric conversion element 101. In such a case, the photoelectric conversion element 101 and the pixel signal processing unit 102 are electrically connected by connection wiring provided for each pixel. The vertical scanning circuit unit 103, the horizontal scanning circuit unit 104, the signal line 107, and the column circuit 105 may also be provided, as described above, on different semiconductor substrates.

Figure 5:
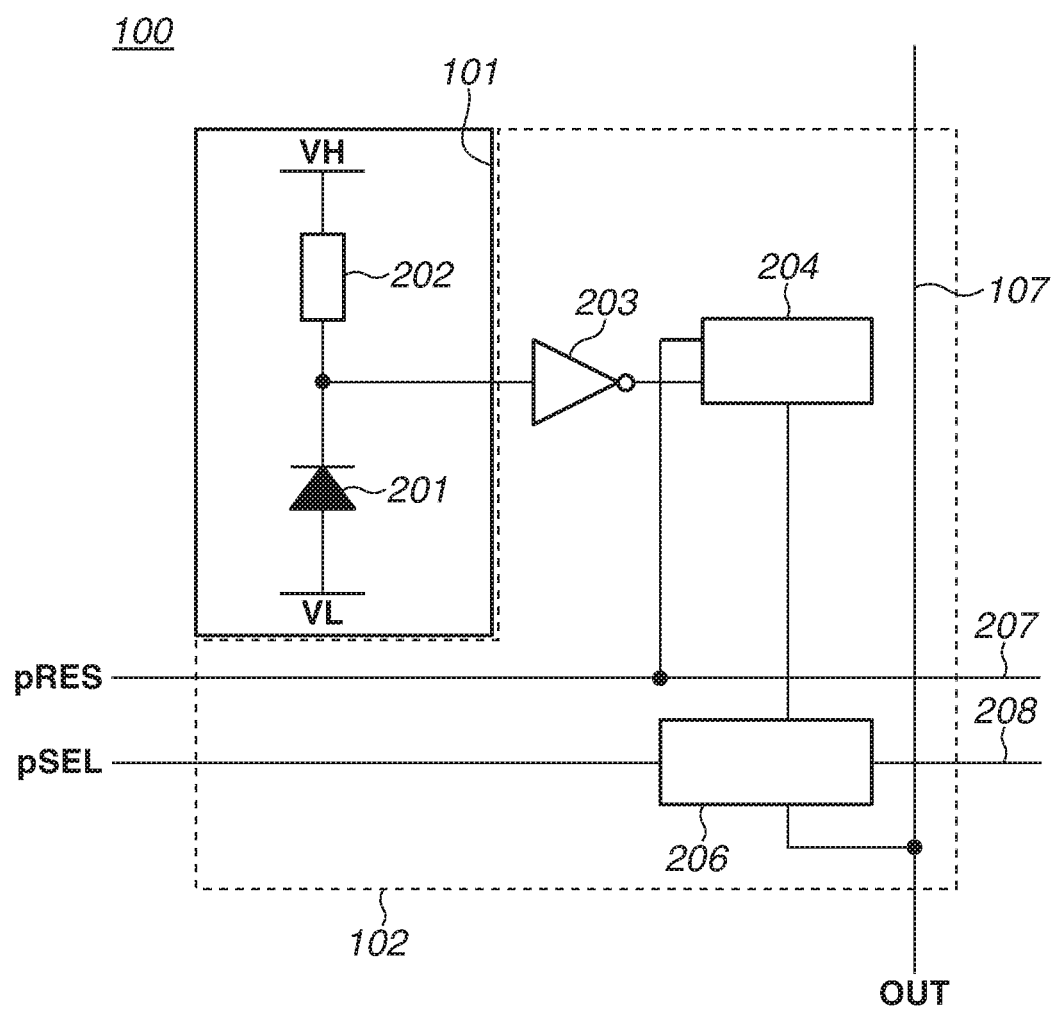
FIG. 5 is a block diagram of a pixel including an equivalent circuit.

FIG. 5 illustrates an example of a block diagram of the pixel 100 including an equivalent circuit according to the present exemplary embodiment. In FIG. 5, one pixel 100 includes the photoelectric conversion element 101 and the pixel signal processing unit 102.

The photoelectric conversion element 101 includes a photoelectric conversion unit 201 and a control unit 202.

The photoelectric conversion unit 201 generates a pair of electric charges according to incident light by photoelectric conversion. An avalanche diode is used for the photoelectric conversion unit 201.

A potential based on a potential VH higher than a potential VL supplied to the anode is supplied to the cathode of the photoelectric conversion unit 201. Then, the potentials are supplied to the anode and the cathode of the photoelectric conversion unit 201 such that a reverse bias is applied to allow the photoelectric conversion unit 201 to act as an avalanche diode. By performing photoelectric conversion while such potentials of reverse bias are supplied, avalanche amplification is caused by an electric charge generated by incident light to generate an avalanche current.

If the potential difference between the anode and the cathode is larger than a breakdown voltage when a potential of reverse bias is supplied, an avalanche diode performs a Geiger mode operation. A photodiode that detects a feeble signal at a single photon level at high speed using the Geiger mode operation is a single photon avalanche diode (SPAD).

If the potential difference between the anode and the cathode of the photoelectric conversion unit 201 is a potential difference or more at which an electric charge generated in the photoelectric conversion unit 201 causes avalanche amplification and is equal to or less than the breakdown voltage, the avalanche diode is put into a linear mode. An avalanche diode that performs photo-detection in the linear mode is called an avalanche photodiode (APD). In the present exemplary embodiment, the photoelectric conversion unit 201 may operate as an avalanche diode in any one of the modes. The potential difference that causes avalanche amplification will be described below.

The control unit 202 is connected to the power supply voltage that supplies the high potential VH and the photoelectric conversion unit 201. The control unit 202 has the function to substitute a voltage signal for any change of the avalanche current generated by the photoelectric conversion unit 201. Further, the control unit 202 functions as a load circuit (quench circuit) during signal amplification by avalanche amplification to work to suppress avalanche amplification by suppressing the voltage supplied to the photoelectric conversion unit 201 (quench operation). As the control unit 202, for example, a resistive element or an active quench circuit that actively suppresses avalanche amplification by detecting an increase in the avalanche current and exercising feedback control is used.

The pixel signal processing unit 102 includes a waveform shaping unit 203, a counter circuit 209, and a selection circuit 206. The waveform shaping unit 203 shapes voltage changes obtained when a photon-level signal is detected to output a pulse signal. For example, an inverter circuit is used as the waveform shaping unit 203. An example using one inverter is illustrated as the waveform shaping unit 203, but a circuit connecting a plurality of inverters in series or other circuits having a waveform shaping effect may also be used.

A pulse signal output from the waveform shaping unit 203 is counted by the counter circuit 209. In the case of an N-bit counter (N: positive integer), the counter circuit 209 can count up to about N-th power of 2 of pulse signals by single photons at maximum. The counted signal is held as a detected signal. When a control pulse pRES is supplied via a drive line 207, detected signals held in the counter circuit 209 are reset.

A control pulse pSEL is supplied to the selection circuit 206 from the vertical scanning circuit unit 103 in FIG. 4 via a drive line 208 to switch electric connection and non-connection between the counter circuit 209 and the signal line 107. For example, a transistor or a buffer circuit to output a signal out of the pixel is used as the selection circuit 206.

Incidentally, electric connection may be switched by arranging a switch such as a transistor between the control unit 202 and the photoelectric conversion unit 201 or between the photoelectric conversion element 101 and the pixel signal processing unit 102. Similarly, the supply of the high potential VH supplied to the control unit 202 or the low potential VL supplied to the photoelectric conversion element 101 may be electrically switched by using a switch such as a transistor.

In the pixel unit 106 in which the plurality of pixels 100 is arranged in a matrix shape, a captured image may be acquired by a rolling shutter operation in which the count of the counter circuit 209 is sequentially reset for each row and detected signals held in the counter circuit 209 are sequentially output for each row.

Alternatively, a captured image may be acquired by a global electronic shutter operation in which the counts of the counter circuit 209 of all pixel rows are reset simultaneously and detected signals held in the counter circuit 209 are sequentially output for each row. When the global electronic shutter operation is performed, it is better to provide a unit to switch between a case when counting by the counter circuit 209 is done and a case when the counting is not done. The unit to switch is, for example, the switch described above.

In the present exemplary embodiment, a configuration that acquires a captured image by using the counter circuit 209 is illustrated. However, instead of the counter circuit 209, the photo-detection apparatus 1010 that acquires pulse detection timing may be configured by using a time to digital converter (TDC) and a memory.

In this case, generation timing of a pulse signal output from the waveform shaping unit 203 is converted into a digital signal by the TDC. A control pulse pREF (reference signal) is supplied to the TDC from the vertical scanning circuit unit 103 in FIG. 4 via a drive line to measure the timing of a pulse signal. The TDC acquires a signal as a digital signal when input timing of a signal output from each pixel via the waveform shaping unit 203 relative to the control pulse pREF is set as a relative time.

For example, a delay line system in which buffer circuits are connected in series to create a delay or a looped TDC system in which delay lines are connected like a loop is used as the circuit of the TDC. Although other systems may be used, a circuit system capable of achieving time resolution equal to or higher than that of the photoelectric conversion unit 201 is used.

A digital signal representing pulse detection timing obtained by the TDC is stored in one or a plurality of memories. When a plurality of memories is arranged, the output to the signal line 107 can be controlled for each memory by supplying a plurality of signals to the selection circuit 206 when a digital signal stored in the memories is output to the signal line 107.

The schematic sectional view and schematic plan views of the avalanche diode according to the present exemplary embodiment will be described with reference to FIGS. 6 to 7C. In FIG. 6, an N-type semiconductor region 1 is arranged in a region where the first semiconductor region 71 in FIG. 1 is arranged, and an N-type semiconductor region 6 is arranged in a region where the second semiconductor region 76 in FIG. 1 is arranged. In FIG. 6, an N-type semiconductor region 4 is arranged in a region where the third semiconductor region 74 in FIG. 1 is arranged, and a P-type semiconductor region 2 is arranged in a region where the fourth semiconductor region 72 in FIG. 1 is arranged. In FIG. 6, an N-type semiconductor region 5 is arranged in a region where the fifth semiconductor region 75 in FIG. 1 is arranged.

First, a section structure of the isolation portion 16 and a photoelectric conversion region surrounded by the isolation portion 16 will be described with reference to FIG. 6.

The isolation portion 16 that separates each of the plurality of pixels 100 is arranged on the semiconductor substrate 15 on which the plurality of pixels 100 is arranged.

The isolation portion 16 is formed of a P-type semiconductor region arranged from the first surface in the depth direction. More specifically, a P-type semiconductor region 3 and a P-type semiconductor region 7 are arranged from the first surface in the depth direction in that order and in contact as the isolation portion 16. The P-type semiconductor region 3 is electrically connected to the P-type semiconductor region 7, a P-type semiconductor region 8 described below, and the P-type semiconductor region 2 described below.

The impurity concentration of the P-type semiconductor region 3 is higher than that of each of the P-type semiconductor region 7, the P-type semiconductor region 8, and the P-type semiconductor region 2. Accordingly, for example, connecting the P-type semiconductor region 3 and a contact plug 17 can make contact resistance lower than connecting the P-type semiconductor region 7 and the contact plug 17.

The N-type semiconductor region 1 is a region whose impurity concentration is higher than that of each of the N-type semiconductor region 6, the N-type semiconductor region 4, and the N-type semiconductor region 5 described below. By adopting such impurity concentrations, the electric field of a depletion layer generated in the N-type semiconductor region 1 can be made strong. Incidentally, a potential that is a reverse bias with respect to the isolation portion 16 is supplied to the N-type semiconductor region 1.

The impurity concentration of the N-type semiconductor region 4 is set lower than that of the N-type semiconductor region 1. Accordingly, an electric charge near the N-type semiconductor region 4 is made easier to move to the N-type semiconductor region 1.

The impurity concentration of the N-type semiconductor region 6 is set lower than that of the N-type semiconductor region 1. For example, when the impurity concentration of the N-type semiconductor region 1 is $6.0\times10^{18}$ [atms/cm$^3$] or more, the impurity concentration of the N-type semiconductor region 6 is set to $1.0\times10^{16}$ [atms/cm$^3$] or more and $1.0\times10^{18}$ [atms/cm$^3$] or less.

In FIG. 6, a configuration in which the N-type semiconductor region 6 having no impurity concentration gradient is arranged in the second semiconductor region 76 in FIG. 1 is illustrated, but the semiconductor region arranged in a region where the second semiconductor region is arranged in FIG. 1 is a region having an impurity concentration gradient. By adopting a configuration in which a region between the N-type semiconductor region 1 and the P-type semiconductor region 3 has an impurity concentration gradient, when compared with a case where the N-type semiconductor region 6 has no impurity concentration gradient, a strong electric field that can arise between the N-type semiconductor region 1 and the P-type semiconductor region 3 can be mitigated.

Figure 20:
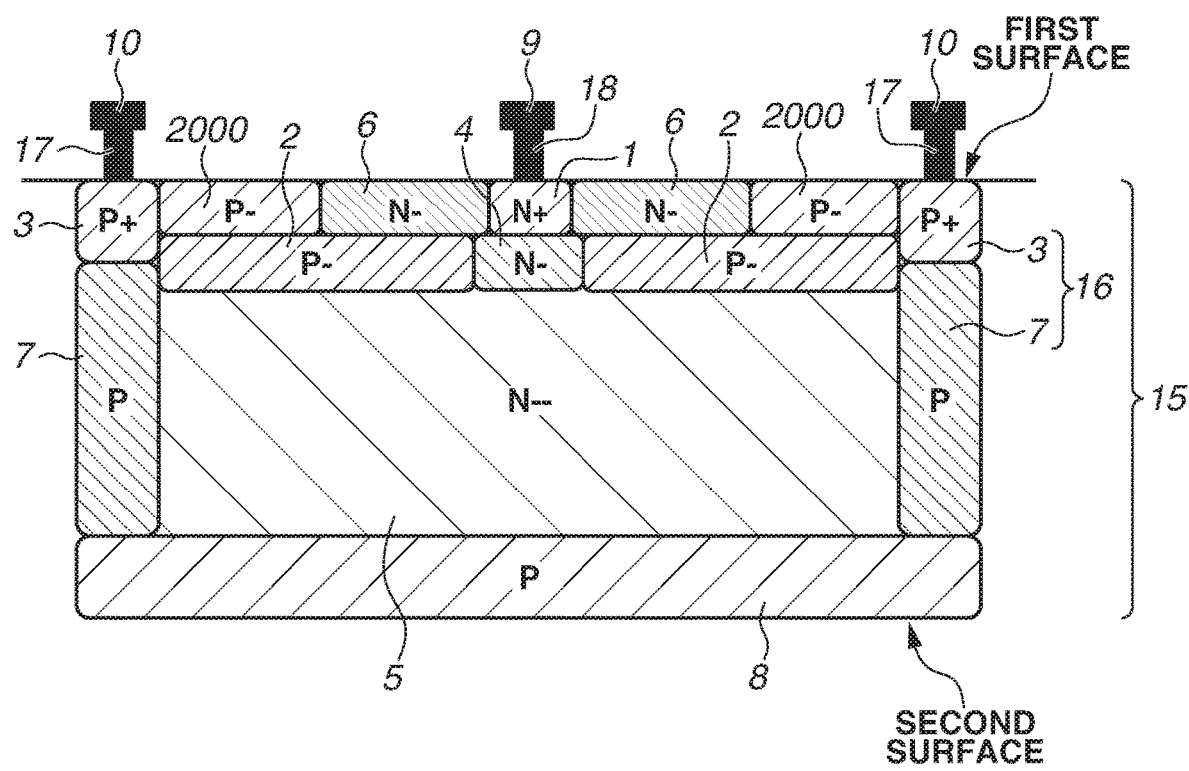
FIG. 20 is a schematic plan view of the avalanche diode.

Two examples of a region having an impurity concentration gradient will be described. The first example is a case where an N-type semiconductor region whose impurity concentration is lower than that of the N-type semiconductor region 1 is arranged in a region near the N-type semiconductor region 1, and an N-type semiconductor region whose impurity concentration is lower than that of the above N-type semiconductor region is arranged in a region near the isolation portion 16. The second example is a case where an N-type semiconductor region whose impurity concentration is lower than that of the N-type semiconductor region 1 is arranged in a region near the N-type semiconductor region 1, and a P-type semiconductor region whose impurity concentration is lower than that of the P-type semiconductor region 3 is arranged in a region near the isolation portion 16. More specifically, as illustrated in FIG. 20, a P-type semiconductor region 2000 whose impurity concentration is lower than that of the P-type semiconductor region 3 is provided between the P-type semiconductor region 3 and the N-type semiconductor region 6.

Next, the impurity concentration of the P-type semiconductor region 2 is set to that of the P-type semiconductor region 7 or less. The P-type semiconductor region 2 and the N-type semiconductor region 4 form a PN junction. Due to the PN junction, the entire region of the N-type semiconductor region 4 becomes a depletion layer region. Further, the depletion layer region extends up to a portion of the N-type semiconductor region 1. A strong electric field is induced in the extended depletion layer region. Due to the strong electric field, avalanche amplification arises in the depletion layer region extended up to the portion of the N-type semiconductor region 1 and a current based on the amplified electric charge is output from a conductive line 9. That is, in the present exemplary embodiment, a photodetection region becomes a depletion layer region in the portion of the N-type semiconductor region 1.

In the present exemplary embodiment, the N-type semiconductor region 4 is formed of an N-type region, instead of a P-type region, because an electric charge can thereby be acquired from a deeper portion by widening the depletion layer deeper into a deep portion of the N-type semiconductor region 5.

Also, if the N-type semiconductor region 6 should be a P-type semiconductor region, a depletion layer region may be formed between the P-type semiconductor region and the N-type semiconductor region 1 so that avalanche amplification may arise between the P-type semiconductor region and the N-type semiconductor region 1. In the present exemplary embodiment, the N-type semiconductor region 1 is formed of the N type because if the depletion layer region is widened to be in contact with the first surface of the semiconductor substrate 15, noise increases.

Further, impurity concentrations of the N-type semiconductor region 1, the N-type semiconductor region 4, and the P-type semiconductor region 2 are set such that the N-type semiconductor region 1 is not entirely depleted when a potential difference that causes avalanche amplification in a depletion layer region generated in a portion of the N-type semiconductor region 1 is supplied. This is because if the depletion layer region is widened to be in contact with the first surface of the semiconductor substrate 15, noise may be produced on the first surface of the semiconductor substrate 15. On the other hand, the impurity concentrations are set such that the N-type semiconductor region 4 is entirely depleted.

The condition for the N-type semiconductor region 4 to be entirely depleted is illustrated in Formula 1. In this case, the impurity concentration of the N-type semiconductor region 4 is an impurity concentration Nd, the impurity concentration of the P-type semiconductor region 2 is an impurity concentration Na, and the elementary electric charge is an elementary electric charge q. Further, the dielectric constant of a semiconductor is a dielectric constant ε, the potential difference of the PN junction between the N-type semiconductor region 4 and the P-type semiconductor region 2 is a potential difference V, and the length of the N-type semiconductor region 4 surrounded by the P-type semiconductor region 2 is a length D.

[Math 1]

$$2 \times \sqrt{\frac{2\varepsilon NaV}{qNd(Nd+Na)}} > D \qquad \text{(Formula 1)}$$

It is assumed that the impurity concentration that does not entirely deplete the N-type semiconductor region 1 is, for example, $6.0 \times 10^{18}$ [atms/cm$^3$] or more. In that case, the impurity concentrations satisfying such a depletion condition are $1.0 \times 10^{16}$ [atms/cm$^3$] or more for the impurity concentration of the P-type semiconductor region 2 and $1.0 \times 10^{17}$ [atms/cm$^3$] or less for the impurity concentration of the N-type semiconductor region 4. However, the impurity concentrations are not limited to the above impurity concentrations.

Then, the potential difference between the N-type semiconductor region 1 and the isolation portion 16 is set such that the electric field in the depth direction induced in the extended depletion layer is sufficiently large. Here, the potential difference that makes the electric field sufficiently large is a potential difference at which an electric charge affected by the electric field causes avalanche amplification. That is, the potential difference is a potential difference between the N-type semiconductor region 1 and the P-type semiconductor region 3 at which the photoelectric conversion unit 201 implements an operation as an avalanche diode (APD or SPAD).

More specifically, the potential difference between the N-type semiconductor region 1 and the P-type semiconductor region 2 is 6 V or more. In this case, as described above, the N-type semiconductor region 4 electrically connected to the N-type semiconductor region 1 entirely becomes a depletion layer region and a strong electric field that can cause avalanche amplification is generated in the depletion layer region extended up to a portion of the N-type semiconductor region 1.

In one embodiment, if the impurity concentrations satisfying the above depletion condition are considered, a potential difference between the N-type semiconductor region 1 and the P-type semiconductor region 3 is 10 V or more and 30 V or less. At this point, for example, a potential of 10 V or more is supplied to the N-type semiconductor region 1 and a potential of 0 V or less is supplied to the P-type semiconductor region 3. However, if the potential difference is 6 V or more, the potential values are not limited to the above values.

In addition, a depletion layer formed between the P-type semiconductor region 2 and the N-type semiconductor region 6 may extend up to the N-type semiconductor region 1 to cause avalanche amplification. In that case, if the N-type semiconductor region 1 is entirely depleted, noise may be produced. Thus, the impurity concentration of the N-type semiconductor region 1 is set so that the N-type semiconductor region 1 is not entirely depleted.

Incidentally, according to the present exemplary embodiment, an electric charge is generated in the N-type semiconductor region 5 and collected and read in the N-type semiconductor region 1. That is, an electric charge generated in a semiconductor region of the first conductivity type is read from the semiconductor region of the first conductivity type.

In contrast, a device discussed in the specification of U.S. Pat. No. 9,209,336 reads an electric charge generated in an N-type epitaxial layer 2 from a p-type anode region 14 after avalanche amplification at the interface between the N-type epitaxial layer 2 and the p-type anode region 14. That is, an electric charge generated in a semiconductor region of the first conductivity type is read from a semiconductor region of the second conductivity type. Also in this respect, the present exemplary embodiment is different from the device discussed in the specification of U.S. Pat. No. 9,209,336.

In FIG. 6, it is assumed that the N-type semiconductor region 5 having an impurity concentration lower than that of the N-type semiconductor region 1 is arranged immediately below the N-type semiconductor region 1 having a high impurity concentration without the P-type semiconductor region 2 and the N-type semiconductor region 4 being provided. In such a case, it is possible to generate an electric charge in the N-type semiconductor region 5 and to read an electric charge from the N-type semiconductor region 1, but it is difficult to implement avalanche amplification under voltage conditions equivalent to those of the present exemplary embodiment. This is because most of the potential difference applied to between the N-type semiconductor region 1 and the P-type semiconductor region 3 is applied to the depletion layer region of the N-type semiconductor region 5 and so the potential difference applied to the avalanche amplification region near the N-type semiconductor region 1 becomes smaller. In the present exemplary embodiment, on the other hand, the N-type semiconductor region 5 is surrounded by P-type semiconductor regions in each direction excluding a location in contact with the N-type semiconductor region 4 and thus, the potential of the N-type semiconductor region 5 is closer to the level of the surrounding P-type semiconductor regions than that of the N-type semiconductor region 1. That is, by suppressing excessive expansion of the depletion layer to a deeper portion of the substrate in the P-type semiconductor region 2, most of the above applied potential difference can be concentrated on the avalanche amplification region near the N-type semiconductor region 1. As a result, a photocarrier can be subjected to avalanche amplification at a lower voltage.

Next, the N-type semiconductor region 5 has an impurity concentration equal to or less than that of the N-type semiconductor region 4. For example, the N-type semiconductor region 5 has an impurity concentration of $1.0 \times 10^{17}$ [atms/cm$^3$] or less. Because of "equal to or less than", the impurity concentration of the N-type semiconductor region 5 and that of the N-type semiconductor region 4 may be equal. Also, at least, the impurity concentration of the N-type semiconductor region 5 is to be less than that of the N-type semiconductor region 1.

In FIG. 6, a region of the same impurity concentrations is illustrated as an example of the N-type semiconductor region 5. However, it is better for the N-type semiconductor region 5 to have an impurity concentration gradient such that a potential structure allowing an electric charge to move to the side of the first surface of the semiconductor substrate 15 is implemented. By adopting such an impurity concentration gradient, an electric charge can easily be moved to the N-type semiconductor region 1.

If the impurity concentration gradient is such that a potential structure allowing an electric charge to move to the side of the first surface of the semiconductor substrate 15 is implemented, in a region where the N-type semiconductor region 5 is arranged, the side of the first surface may be an N-type semiconductor region and the side of the second surface may be a P-type semiconductor region.

Alternatively, a P-type semiconductor region whose impurity concentration is lower than that of the P-type semiconductor region 2 may be arranged in place of the N-type semiconductor region 5. Also in that case, it is better to have an impurity concentration gradient such that a potential structure allowing an electric charge to move to the side of the first surface of the semiconductor substrate 15 is implemented.

For example, a P-type semiconductor region has a first region, a second region arranged at a position deeper than the first region with respect to the first surface, and a third region arranged at a position deeper than the second region with respect to the first surface. Then, if the first region has a first impurity concentration, the second region has a second impurity concentration, and the third region has a third impurity concentration, the first impurity concentration<the second impurity concentration<the third impurity concentration may be set. Incidentally, the first impurity concentration is lower than the impurity concentration of the P-type semiconductor region 2. Here, the P-type semiconductor region arranged in place of the N-type semiconductor region 5 is divided into three regions, but the present exemplary embodiment is not limited to such an example.

The P-type semiconductor region 8 is arranged at a position deeper than the N-type semiconductor region 5 and defines the depth of a photoelectric conversion region. The N-type semiconductor region 5 forms a PN junction with each of the P-type semiconductor region 2, the P-type semiconductor region 7, and the P-type semiconductor region 8. The impurity concentration of the P-type semiconductor region 8 is set higher than that of the P-type semiconductor region 2. Accordingly, an electric charge generated near the P-type semiconductor region 8 can easily move in the direction of the first surface.

A contact plug 18 is connected to the N-type semiconductor region 1 and the conductive line 9 is connected to the contact plug 18. Also, the contact plug 17 is connected to the P-type semiconductor region 3 and a conductive line 10 is connected to the contact plug 17. Then, the conductive line 9 or the conductive line 10 is connected to the control unit 202 such as a resistive element to perform a quench operation. Hereinafter, it is assumed that the control unit 202 is connected to the conductive line 9.

In FIG. 6, the contact plug 17 and the conductive line 10 are assumed to be arranged on the side of the first surface. However, the contact plug 17 and the conductive line 10 may also be arranged on the side of the second surface.

In one embodiment, when the contact plug 17 and the conductive line 10 are arranged on the side of the second surface, the impurity concentration of a region where the contact plug 17 is arranged of the P-type semiconductor region 8 is higher than that of the P-type semiconductor region 7. That is, the region becomes the P-type semiconductor region 3. In this case, the contact plug 17 is not connected to the P-type semiconductor region 3 arranged on the side of the first surface and thus, it is better to set the impurity concentration to a comparable level of the P-type semiconductor region 7. Accordingly, the electric field generated between the P-type semiconductor region 3 and the N-type semiconductor region 1 can be mitigated.

When the isolation portion 16 has a dielectric isolation portion on the side of the first surface, the contact plug 17 and the conductive line 10 are also arranged on the side of the second surface. In this case, the isolation portion 16 is arranged such that the dielectric isolation portion, the P-type semiconductor region 7, and the P-type semiconductor region 3 are put on top of the others in that order from the first surface in the depth direction.

Figure 7A:
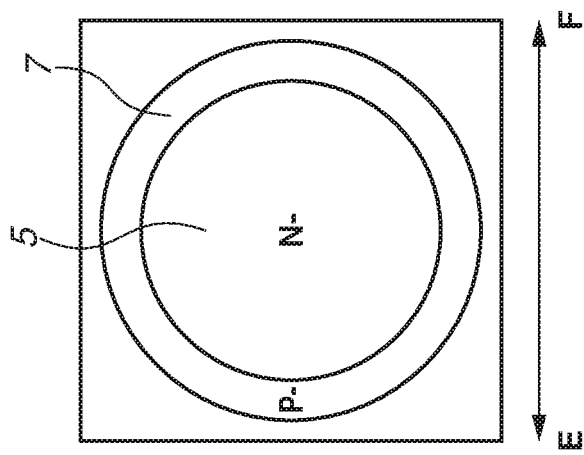
FIGS. 7A to 7C are schematic plan views of the avalanche diode.
Figure 7B:
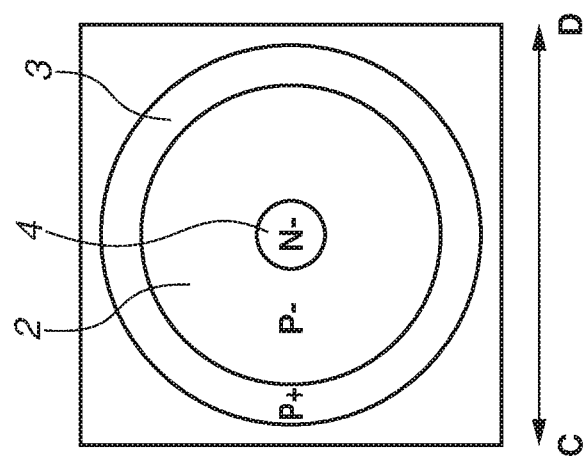

Next, a planar structure of the isolation portion 16 and the photoelectric conversion region surrounded by the isolation portion 16 in any depth of the section structure in FIG. 6 will be described with reference to FIGS. 7A to 7C. In FIGS. 7A to 7C, the boundary of each semiconductor region is depicted in a circular form, but the boundary is not limited to such an example.

FIG. 7A illustrates a schematic plan view of a line segment AB in the depth X of FIG. 6. The N-type semiconductor region 1 is included in the N-type semiconductor region 6. The N-type semiconductor region 6 is included in the P-type semiconductor region 3. Also, the area of the N-type semiconductor region 6 is larger than that of the N-type semiconductor region 1.

FIG. 7B illustrates a schematic plan view of a line segment CD in the depth Y of FIG. 6. The N-type semiconductor region 4 is included in the P-type semiconductor region 2. The P-type semiconductor region 2 is included in the P-type semiconductor region 3.

Figure 7C:
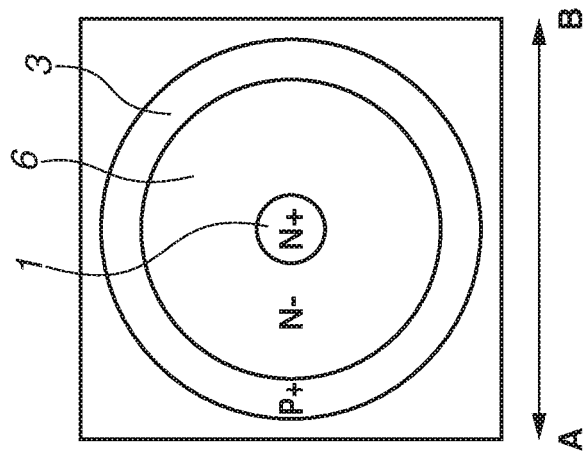

FIG. 7C illustrates a schematic plan view of a line segment EF in the depth Z of FIG. 6. The N-type semiconductor region 5 is included in the P-type semiconductor region 7.

Incidentally, when FIG. 7B is put on top of FIG. 7C, the N-type semiconductor region 4 and the P-type semiconductor region 2 overlap the N-type semiconductor region 5 in plane view.

Also, when FIG. 7A is put on top of FIG. 7B, the N-type semiconductor region 1 overlaps at least a portion of the N-type semiconductor region 4 and the N-type semiconductor region 6 overlaps at least a portion of the P-type semiconductor region 2 in plane view.

Next, a method for manufacturing the avalanche diode in the schematic sectional view illustrated in FIG. 6 will be described with reference to FIGS. 8A to 8D. Processes with no specifically mentioned order may appropriately be interchanged. In addition, regarding processes whose description is omitted in FIGS. 8A to 8D, publicly known manufacturing methods may be applied.

Figure 8A:
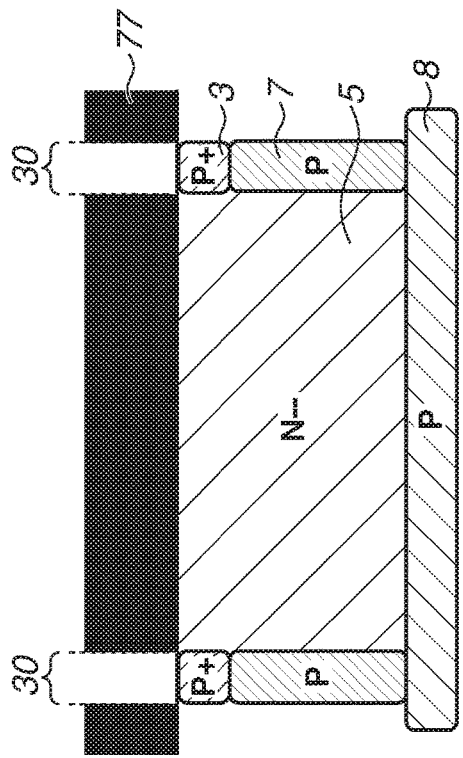
FIGS. 8A to 8D illustrate a method for manufacturing the avalanche diode.

As illustrated in FIG. 8A, P-type impurity ion implantation (hereinafter, simply ion implantation) is performed in a region to be the N-type semiconductor region from the direction normal to the first surface of the semiconductor substrate 15. Accordingly, the P-type semiconductor region 8 is formed at a deep position from the first surface of the semiconductor substrate 15.

Figure 8B:
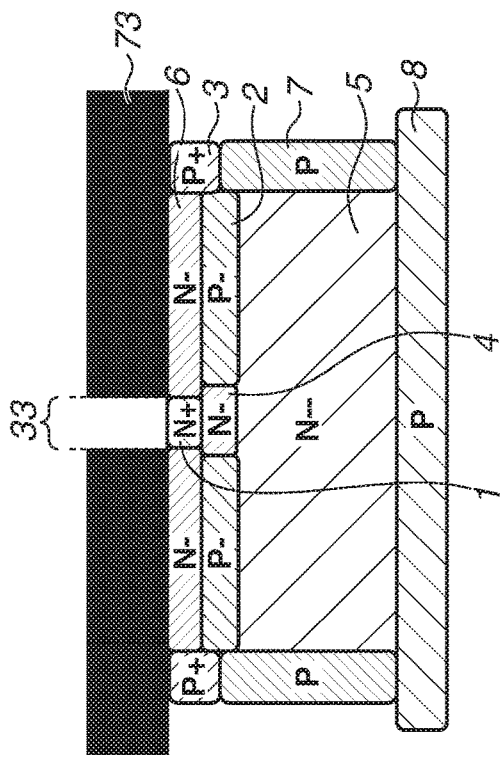

Next, as illustrated in FIG. 8B, a mask 77 is formed on the first surface of the semiconductor substrate 15. The mask 77 has an opening 30. Then, the P-type semiconductor region 3 and the P-type semiconductor region 7 are formed to be arranged in that order from the first surface by performing P-type ion implantation from the direction normal to the first surface of the semiconductor substrate 15. At this point, the P-type semiconductor region 7 and a portion of the P-type semiconductor region 8 are connected. Also, the impurity concentration of the P-type semiconductor region 3 is set higher than that of the P-type semiconductor region 7. More specifically, for example, a method for performing ion implantation a plurality of times using different amounts of ion implantation energy may be used.

Figure 8C:
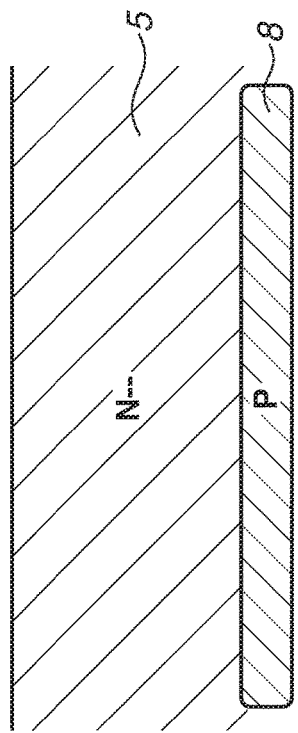

Next, the mask 77 is removed and a mask 78 is arranged. The mask 78 has an opening 32. Then, as illustrated in FIG. 8C, a region to be the P-type semiconductor region 2 is formed by performing P-type ion implantation from the direction parallel to the direction normal to the first surface of the semiconductor substrate 15. Then, a region to be the N-type semiconductor region 6 is formed by performing N-type ion implantation at a position shallower from the first surface than a position at which the P-type ion implantation has been performed to form a region to be the P-type semiconductor region 2. Here, a region to be the N-type semiconductor region 6 is formed after a region to be the P-type semiconductor region 2 is formed, but the order may be reversed.

Figure 8D:
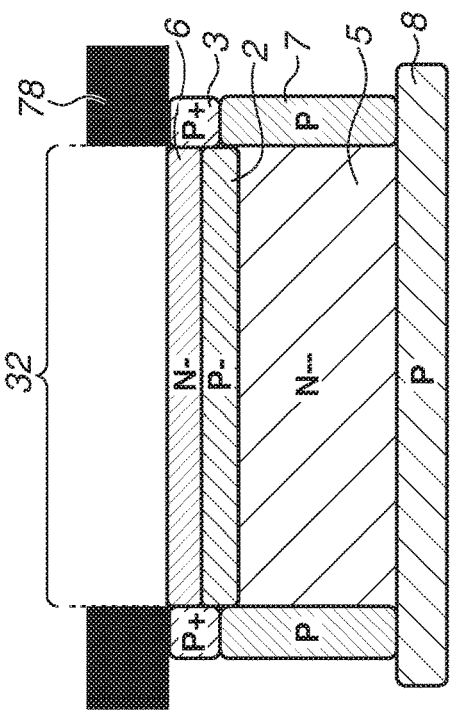

Next, the mask 78 is removed and a mask 73 is arranged. The mask 73 has an opening 33. As illustrated in FIG. 8D, the N-type semiconductor region 4 is formed in a portion of the region to be the P-type semiconductor region 2 by performing N-type ion implantation in the depth in which the region to be the P-type semiconductor region 2 is arranged from the direction parallel to the direction normal to the first surface of the semiconductor substrate 15.

Then, the N-type semiconductor region 1 is formed by performing N-type ion implantation on the side of the first surface of the semiconductor substrate 15 from the direction parallel to the direction normal to the first surface of the semiconductor substrate 15. Here, the N-type semiconductor region 4 is formed first, but the N-type semiconductor region 1 may be formed first.

Thus, when ion implantation is performed using impurity ions of the same conductivity type, the diffusion of impurity ions in the direction parallel to the first surface as a plane of incidence is larger when ion implantation is performed at a deep position with respect to the first surface than when ion implantation is performed at a shallow position with respect to the first surface. That is, when ion implantation is performed using the same mask, the N-type semiconductor region 1 is included in the N-type semiconductor region 4 in plane view.

Impurity ions having different thermal diffusion coefficients may be used as impurity ions injected to form the N-type semiconductor region 1 and the N-type semiconductor region 4. According to such a configuration, the degree of freedom of potential design of regions where the N-type semiconductor region 1 and the N-type semiconductor region 4 are arranged is improved.

In FIG. 8D, if ion implantation is performed using different masks when the N-type semiconductor region 1 and the N-type semiconductor region 4 are formed, positional displacements may arise so that the tunnel effect may be produced due to generation of an asymmetric electric field distribution. According to the manufacturing method according to the present exemplary embodiment, on the other hand, the N-type semiconductor region 1 and the N-type semiconductor region 4 are formed using the same mask and thus, positional displacements in both semiconductor regions can be suppressed so that the tunnel effect that may arise due to positional displacements can be suppressed.

Figure 9A:
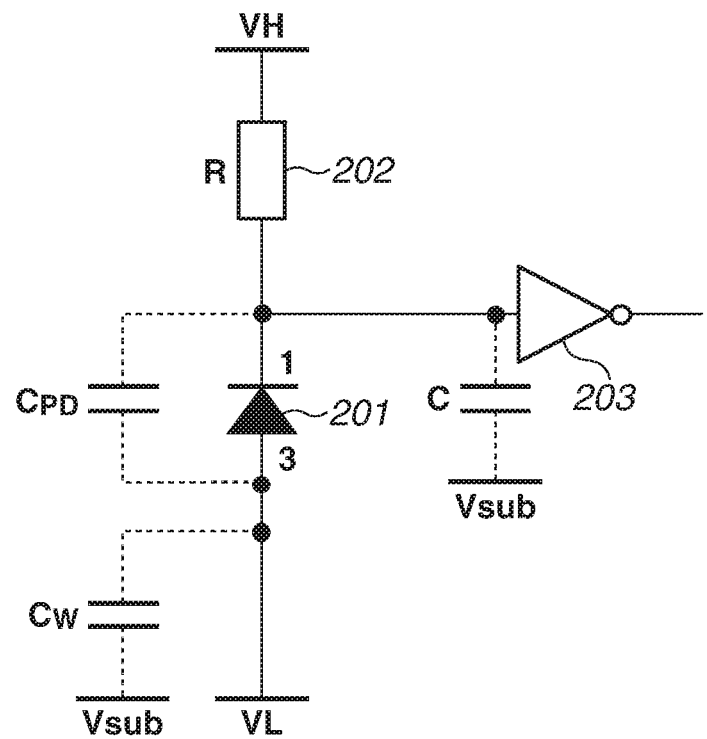
FIGS. 9A and 9B are equivalent circuit diagrams.

Next, the control unit 202 according to the present exemplary embodiment will be described with reference to FIGS. 9A and 9B. In the present exemplary embodiment, the control unit 202 has two configurations. The first configuration is, as illustrated in FIG. 9A, a configuration in which the control unit 202 is arranged on the side of the cathode to which the high potential VH of the photoelectric conversion unit 201 is supplied. The second configuration is, as illustrated in FIG. 9B, a configuration in which the control unit 202 is arranged on the side of the anode to which the low potential VL of the photoelectric conversion unit 201 is supplied.

Figure 9B:
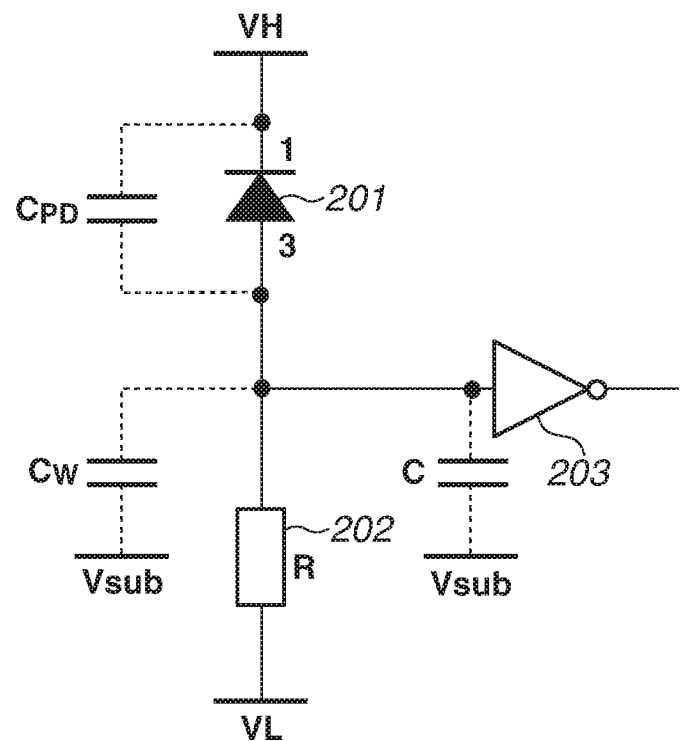

In the configurations of FIG. 9A and FIG. 9B, a fixed time is needed to return to the bias in the initial state of the photoelectric conversion unit 201 through the voltage drop by the control unit 202 after the input potential of the waveform shaping unit 203 changes due to an avalanche current. The period needed to return to a bias state capable of detecting an electric charge next after an electric charge is detected once is called a dead time. The number of electric charges that can be counted per unit time increases and the dynamic range as a photo-detection apparatus increases with a decreasing dead time.

As an example, when the control unit 202 is a resistive element, the dead time (id [s]) of an avalanche diode according to the present exemplary embodiment is determined by the product of the resistance (R [Ω]) and the capacity (C [F]) of an input terminal. In the following formulas, the PN junction capacity of the photoelectric conversion unit 201 is denoted as Cpd, the capacity of a well of the photoelectric conversion unit 201 is denoted as Cw, and the parasitic capacity of a wiring/diffusion layer is denoted as C.

In the case of FIG. 9A, the dead time is determined by Formula 2:

[Math 2]

$$\tau d = R(Cpd + C) \quad \text{(Formula 2)}$$

In the case of FIG. 9B, the dead time is determined by Formula 3:

[Math 3]

$$\tau d = R(Cpd + Cw + C) \quad \text{(Formula 3)}$$

The PN junction capacity Cpd of the photoelectric conversion unit 201 is a PN junction capacity of a photo-detection region that induces a strong electric field to cause avalanche amplification. Thus, the PN junction capacity Cpd changes in proportion to the area of the photo-detection region. That is, if the area of the photo-detection region is increased to improve photo-detection efficiency, the PN junction capacity Cpd increases so that the dead time increases. As a result, the dynamic range decreases.

In other words, the photo-detection efficiency and the dynamic range are in a trade-off relationship. According to a pixel structure in the present exemplary embodiment, on the other hand, the area of the photo-detection region can be decreased while ensuring a large area of the photoelectric conversion region. Thus, Cpd can be reduced and the dead time can be reduced. As a result, high photo-detection efficiency and a wide dynamic range can be achieved at the same time.

Improvement effect of the dynamic range due to the pixel structure according to the present exemplary embodiment illustrates up more conspicuously in the configuration of FIG. 9A than that of FIG. 9B. For example, if the ratio of Cpd of an SPAD structure according to the present exemplary embodiment to that of a conventional SPAD structure is A (0<A<1), the rates of improvement A of the dynamic range in circuit systems of FIG. 9A and FIG. 9B are represented by Formula 4 and Formula 5, respectively:

[Math 4]

$$\Delta 1=(1-A)Cpd/(ACpd+C) \quad \text{(Formula 4)}$$

[Math 5]

$$\Delta 2=(1-A)Cpd/(ACpd+Cw+C) \quad \text{(Formula 5)}$$

In Formula 4 and Formula 5, calculations were done using the fact that the dynamic range is inversely proportional to the dead time. From the above formulas, it is clear that $\Delta 1>\Delta 2$ is satisfied.

From the above, the rate of improvement of the dynamic range when the configurations of FIG. 9A and FIG. 9B are applied to the configuration according to the present exemplary embodiment is in principle higher in FIG. 9A than in FIG. 9B.

The description heretofore has been provided assuming that the control unit 202 is a resistive element, but the same holds when the control unit 202 is an active quench circuit.

From the above, the improvement effect of the dynamic range can be made larger when the control unit 202 for the pixel according to the present exemplary embodiment is arranged on the side of the cathode of the photoelectric conversion unit 201 than on the side of the anode.

According to the configuration of the present exemplary embodiment, deterioration of photo-detection efficiency can be suppressed by forming a path on which an electric charge moves. That is, noise can be reduced while deterioration of photo-detection efficiency being suppressed.

Figure 10:
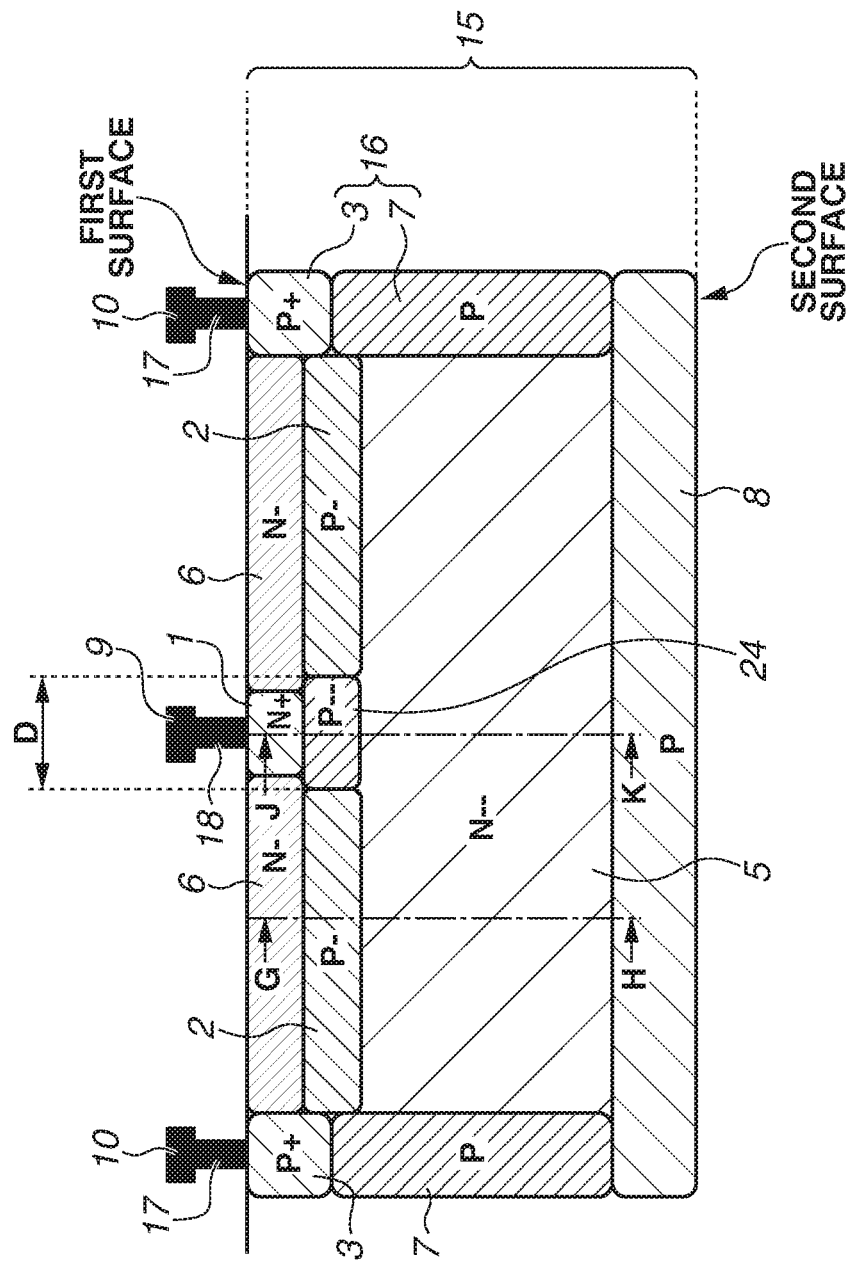
FIG. 10 is a schematic sectional view of the avalanche diode.

FIG. 10 is a schematic sectional view of the avalanche diode according to a second exemplary embodiment. FIG. 4, FIG. 5, FIGS. 8A to 8D, and FIGS. 9A and 9B are the same as in the first exemplary embodiment. Also, similar reference signs are attached to units having similar functions in FIGS. 1 to 9B and a detailed description thereof is omitted. FIG. 10 is different in that a P-type semiconductor region 24 is arranged in the region where the N-type semiconductor region 4 is arranged in FIG. 6.

In FIG. 10, the N-type semiconductor region 1 and the P-type semiconductor region 24 form a PN junction. Also, the P-type semiconductor region 3 is electrically connected to the P-type semiconductor region 24 via the P-type semiconductor region 2. Thus, the potential of the P-type semiconductor region 24 is an inversely biased potential of the N-type semiconductor region 1. Then, a strong electric field is induced in the PN junction region of the N-type semiconductor region 1 and the P-type semiconductor region 24. Avalanche amplification is caused in the PN junction region by the strong electric field and a current based on the amplified electric charge is output from the conductive line 9 or the conductive line 10. That is, in the present exemplary embodiment, the photo-detection region is the PN junction region of the N-type semiconductor region 1 and the P-type semiconductor region 24. If configured in this manner, the potential difference needed to cause avalanche amplification can be made smaller than in the first exemplary embodiment. That is, the potential difference between the N-type semiconductor region 1 and the P-type semiconductor region 3 in the present exemplary embodiment can be made smaller than the potential difference between the N-type semiconductor region 1 and the P-type semiconductor region 3 in the first exemplary embodiment.

In FIG. 10, the impurity concentration of the P-type semiconductor region 24 is lower than that of the P-type semiconductor region 2 and that of the P-type semiconductor region 7. Thus, the above potential relationship as illustrated in FIG. 3 applies also in the present exemplary embodiment.

The impurity concentration of the N-type semiconductor region 1 is set such that when potentials that cause avalanche amplification in the PN junction are supplied, as described above, the N-type semiconductor region 1 is not entirely depleted.

In the present exemplary embodiment, the impurity concentration that does not entirely deplete the N-type semiconductor region 1 is, for example, an impurity concentration of $6.0\times10^{18}$ [atms/cm$^3$] or more in the N-type semiconductor region 1. Then, the impurity concentration of the P-type semiconductor region 24 is $1.0\times10^{17}$ [atms/cm$^3$] or less. This is because if the depletion layer region widens to be in contact with the first surface of the semiconductor substrate 15, noise may arise on the first surface of the semiconductor substrate 15. However, the impurity concentrations are not limited to the above examples.

More specifically, the potential difference between the N-type semiconductor region 1 and the P-type semiconductor region 24 when the photoelectric conversion unit 201 implements an operation as an avalanche diode (APD or SPAD) is 6 V or more.

In one embodiment, if the above impurity concentration relationship is considered, a potential difference between the N-type semiconductor region 1 and the P-type semiconductor region 24 is 10 V or more. In this case, for example, the potential of 10 V or more is supplied to the N-type semiconductor region 1 and the potential of 0 V or less is supplied to the P-type semiconductor region 24 via the P-type semiconductor region 2. However, the potentials are not limited to the above values if the potential difference is 6 V or more.

When the manufacturing method illustrated in FIGS. 8A to 8D is applied in the present exemplary embodiment, the P-type semiconductor region 24 is formed by performing N-type ion implantation such that the impurity concentration in a portion of the region to be the P-type semiconductor region 2 is locally decreased in FIG. 8D.

Also in the present exemplary embodiment, effects similar to those in the first exemplary embodiment are achieved.

Figure 11:
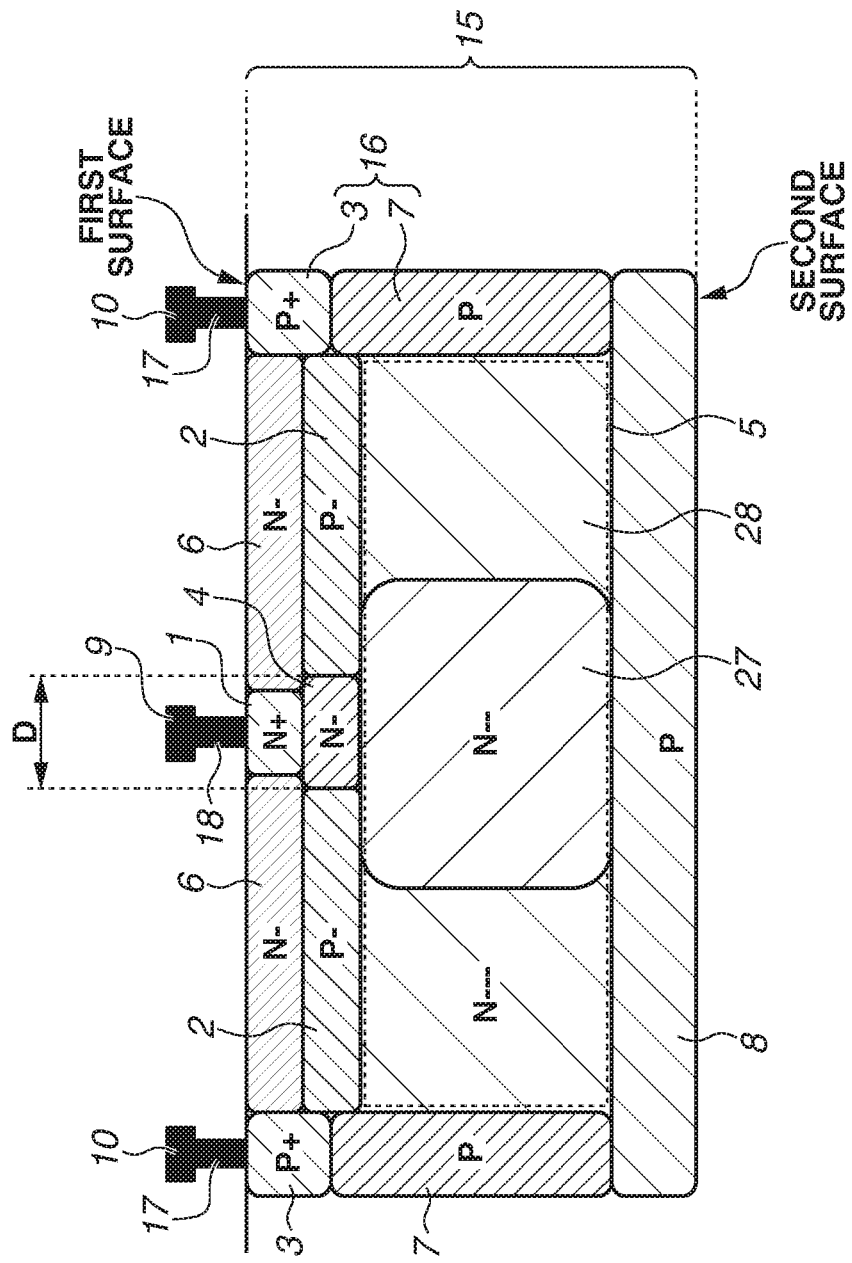
FIG. 11 is a schematic sectional view of the avalanche diode.

FIG. 11 is a schematic sectional view of the avalanche diode according to a third exemplary embodiment. Similar reference signs are attached to units having similar functions in FIGS. 1 to 10 and a detailed description thereof is omitted.

FIG. 11 is different from the potential in the region in which the N-type semiconductor region 5 is arranged in FIG. 6 in that the height of the potential of a region farther from the isolation portion 16 in the direction parallel to the first surface is lower than that of a region closer to the isolation portion 16.

In FIG. 11, an N-type semiconductor region 28 is arranged in a region closer to the isolation portion 16 in the direction parallel to the first surface and an N-type semiconductor region 27 is arranged in a region farther from the isolation portion 16.

In the present exemplary embodiment, an electric charge is made more movable from the N-type semiconductor region 28 to the N-type semiconductor region 27 by creating an impurity concentration relationship in which the height of the potential in the N-type semiconductor region 27 is lower than that of the potential in the N-type semiconductor region 28.

In other words, the height of the potential in a region (N-type semiconductor region 27) farther from the isolation portion 16 in the direction parallel to the first surface is lower than that of the potential in a region (N-type semiconductor region 28) closer to the isolation portion 16.

Thus, the impurity concentration of the N-type semiconductor region 28 is lower than that of the N-type semiconductor region 27. Then, the impurity concentration of the N-type semiconductor region 27 is made lower than that of the N-type semiconductor region 4 to form a gradient of the potential to the photo-detection region.

If a P-type semiconductor region is arranged instead of the N-type semiconductor region 27, a P-type semiconductor region whose impurity concentration is higher than that of the P-type semiconductor region arranged instead is arranged instead of the N-type semiconductor region 28.

According to such a configuration, if the direction from the position where the isolation portion 16 is arranged toward the position where the N-type semiconductor region 27 is arranged is defined as an in-plane direction, an electric field in the in-plane direction is induced by adopting an impurity distribution that allows an electric charge to move in the in-plane direction. An electric charge generated deep inside the semiconductor substrate 15 is moved in the in-plane direction by this electric field.

According to such a configuration, for example, the time needed for an electric charge generated deep inside the semiconductor substrate 15 to move to the photo-detection region can be reduced.

Further, as described above, a potential allowing an electric charge to easily move from a deep position of the first surface of the semiconductor substrate 15 to a shallow position is adopted. By adopting such a potential relationship, the time needed for an electric charge to move to the photo-detection region can further be reduced.

The present exemplary embodiment can be applied to all exemplary embodiments.

Figure 12:
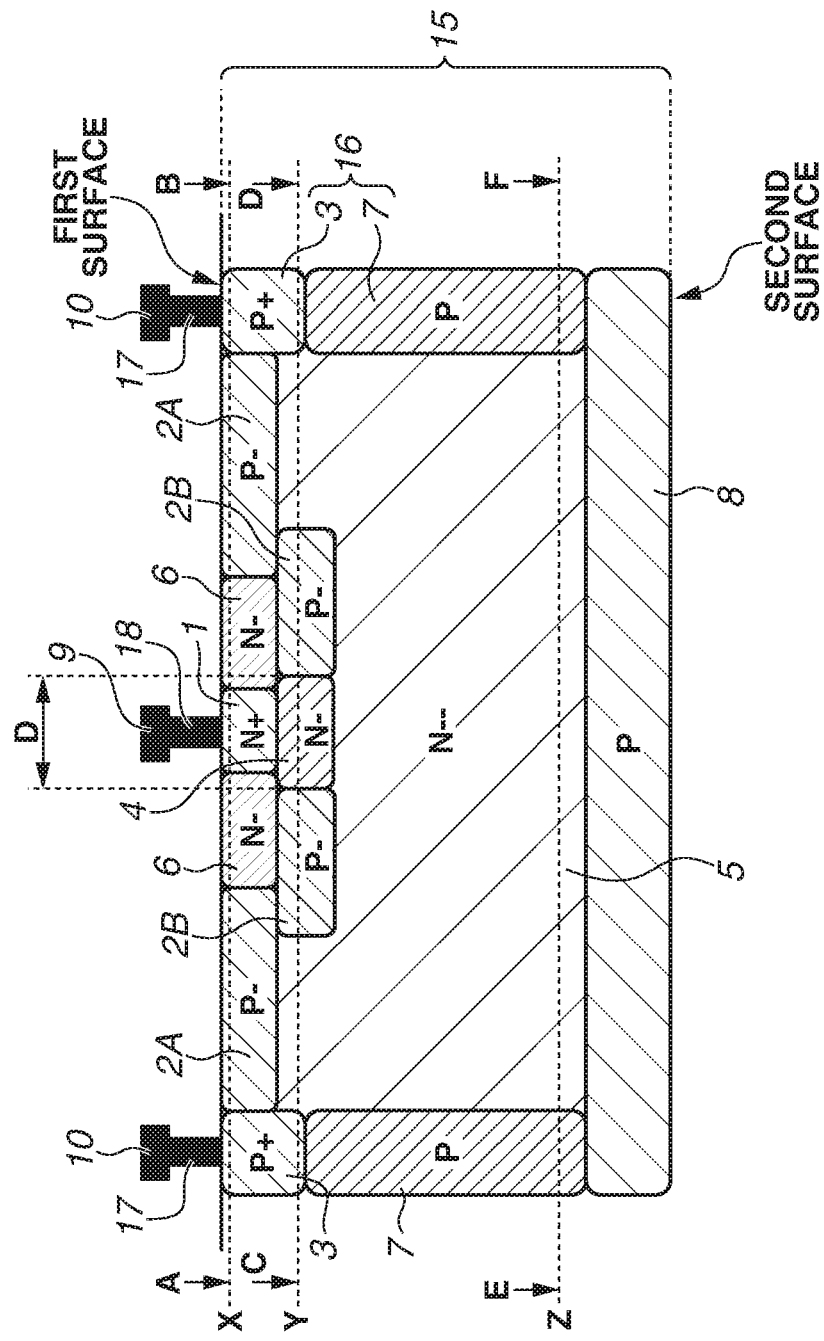
FIG. 12 is a schematic sectional view of the avalanche diode.

FIG. 12 is a schematic sectional view of the avalanche diode according to a fourth exemplary embodiment. Similar reference signs are attached to units having similar functions in FIGS. 1 to 11 and a detailed description thereof is omitted.

FIG. 12 is different from the P-type semiconductor region 2 in FIG. 6 in that a P-type semiconductor region 2B and a P-type semiconductor region 2A having different depths are configured.

In FIG. 12, the P-type semiconductor region 2 includes the P-type semiconductor region 2B and the P-type semiconductor region 2A. The P-type semiconductor region 2A is arranged between the N-type semiconductor region 6 and the P-type semiconductor region 3 constituting the isolation portion 16 in the first depth X. The P-type semiconductor region 2B is arranged between the N-type semiconductor region 5 and the N-type semiconductor region 4 in the second depth Y. A portion of the P-type semiconductor region 2A is in contact with the N-type semiconductor region 5 and the other region of the P-type semiconductor region 2A is in contact with the P-type semiconductor region 2B.

Figure 13A:
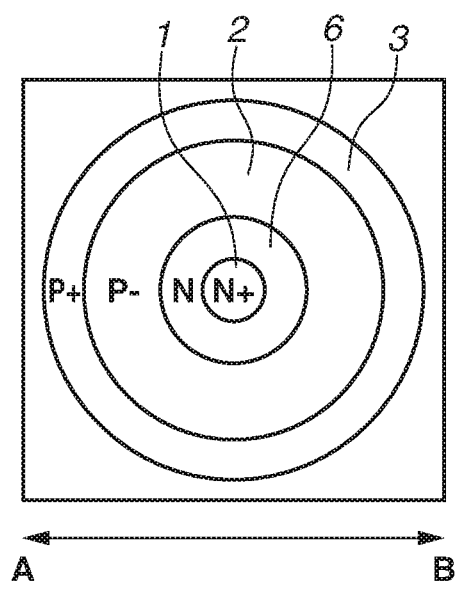
FIGS. 13A and 13B are schematic plan views of the avalanche diode.
Figure 13B:
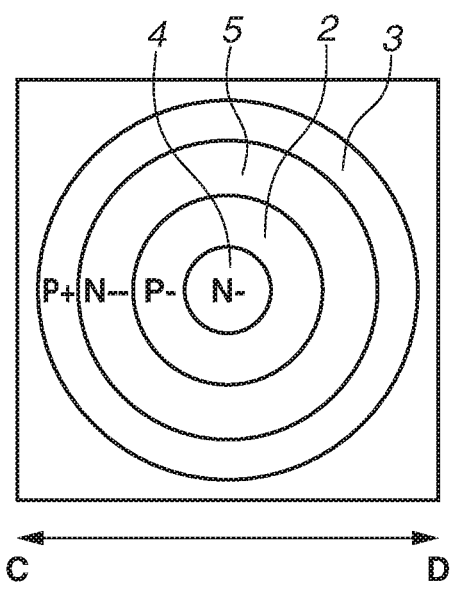

Next, the planar structure of the isolation portion 16 and the photoelectric conversion region surrounded by the isolation portion 16 in any depth of the section structure in FIG. 12 will be described with reference to FIGS. 13A and 13B. In FIGS. 13A and 13B, the boundary of each semiconductor region is depicted in a circular form, but the boundary is not limited to such an example. Incidentally, the schematic plan view of the line segment EF in the depth Z is similar to FIG. 7C and so is omitted.

FIG. 13A illustrates a schematic plan view of the line segment AB in the first depth X of FIG. 12. The N-type semiconductor region 1 is included in the N-type semiconductor region 6. The N-type semiconductor region 6 is included in the P-type semiconductor region 2A. The P-type semiconductor region 2A is included in the P-type semiconductor region 3.

FIG. 13B illustrates a schematic plan view of the line segment CD in the second depth Y of FIG. 12. The N-type semiconductor region 4 is included in the P-type semiconductor region 2B. The P-type semiconductor region 2B is included in the N-type semiconductor region 5. The N-type semiconductor region 5 is included in the P-type semiconductor region 3.

When FIG. 13A is put on top of FIG. 13B, the P-type semiconductor region 2A overlaps the P-type semiconductor region 2B and the N-type semiconductor region 5.

According to the configuration in the present exemplary embodiment, a portion of the region where the P-type semiconductor region 2 is arranged in the second depth Y of FIG. 6 can be changed to the N-type semiconductor region 5. Accordingly, particularly when the front-side illumination type is adopted, photo-detection efficiency of short-wavelength light can be improved.

The present exemplary embodiment can be applied to all exemplary embodiments.

FIG. 14 is a schematic sectional view of the avalanche diode according to a fifth exemplary embodiment. Similar reference signs are attached to units having similar functions in FIGS. 1 to 13B and a detailed description thereof is omitted. FIG. 14 is different from FIG. 6 in that a plurality of the N-type semiconductor regions 1 and a plurality of the N-type semiconductor regions 4 are arranged.

FIG. 14 illustrates a configuration in which two each of the N-type semiconductor regions 1 and the N-type semiconductor regions 4 are arranged, but the number of regions is not limited to two as long as more than one region is arranged.

An N-type semiconductor region 1A is surrounded by the N-type semiconductor region 6. Similarly, an N-type semiconductor region 1B is surrounded by the N-type semiconductor region 6.

An N-type semiconductor region 4A is surrounded by the P-type semiconductor region 2. Similarly, an N-type semiconductor region 4B is surrounded by the P-type semiconductor region 2.

Figure 15A:
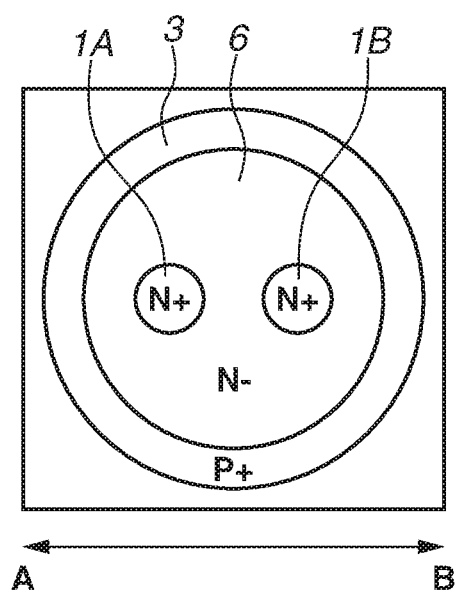
FIGS. 15A and 15B are schematic plan views of the avalanche diode.
Figure 15B:
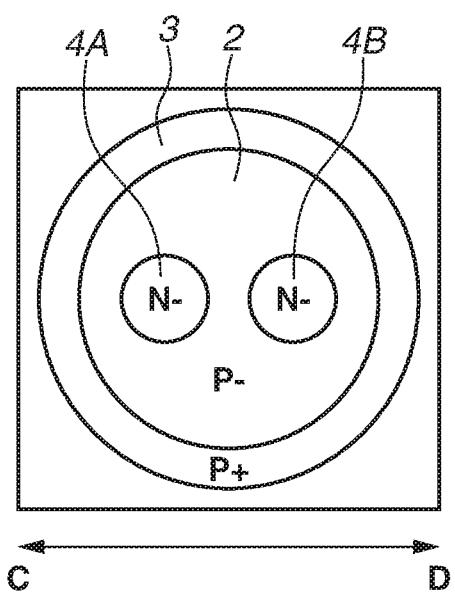

Next, the planar structure of the isolation portion 16 and the photoelectric conversion region surrounded by the isolation portion 16 in any depth of the section structure in FIG. 14 will be described with reference to FIGS. 15A and 15B. In FIGS. 15A and 15B, the boundary of each semiconductor region is depicted in a circular form, but the boundary is not limited to such an example. Incidentally, the schematic plan view of the line segment EF in the depth Z is similar to FIG. 7C and so is omitted.

FIG. 15A illustrates a schematic plan view of the line segment AB in the depth X of FIG. 14. The N-type semiconductor region 1A and the N-type semiconductor region 1B are each included in the N-type semiconductor region 6. The N-type semiconductor region 6 is included in the P-type semiconductor region 3. The area of the N-type semiconductor region 6 is larger than that of the N-type semiconductor region 1A or the N-type semiconductor region 1B.

FIG. 15B illustrates a schematic plan view of the line segment CD in the depth Y of FIG. 14. The N-type semiconductor region 4A and the N-type semiconductor region 4B are each included in the P-type semiconductor region 2. The P-type semiconductor region 2 is included in the P-type semiconductor region 7.

When FIG. 15B is put on top of FIG. 7C, the N-type semiconductor region 4A, the N-type semiconductor region 4B, and the P-type semiconductor region 2 overlap the N-type semiconductor region 5.

Also when FIG. 15A is put on top of FIG. 15B, the N-type semiconductor region 1A overlaps at least a portion of the N-type semiconductor region 4A in plane view. The N-type semiconductor region 1B overlaps at least a portion of the N-type semiconductor region 4B in plane view. As described above, all regions in the N-type semiconductor region 1 overlap the N-type semiconductor region 4 in plane view like being included therein.

When FIG. 15A is put on top of FIG. 15B, the N-type semiconductor region 6 overlaps at least a portion of the P-type semiconductor region 2.

According to the configuration in the present exemplary embodiment, an average moving distance of an electric charge generated in the photoelectric conversion region to the photo-detection region can be shortened by the N-type semiconductor region 1 and the N-type semiconductor region 4, each of which arranged in a plurality of locations. Therefore, the time needed for electric charge detection of an electric charge generated at a deep position of the photoelectric conversion region can be reduced.

The present exemplary embodiment can be applied to all exemplary embodiments.

Figure 16:
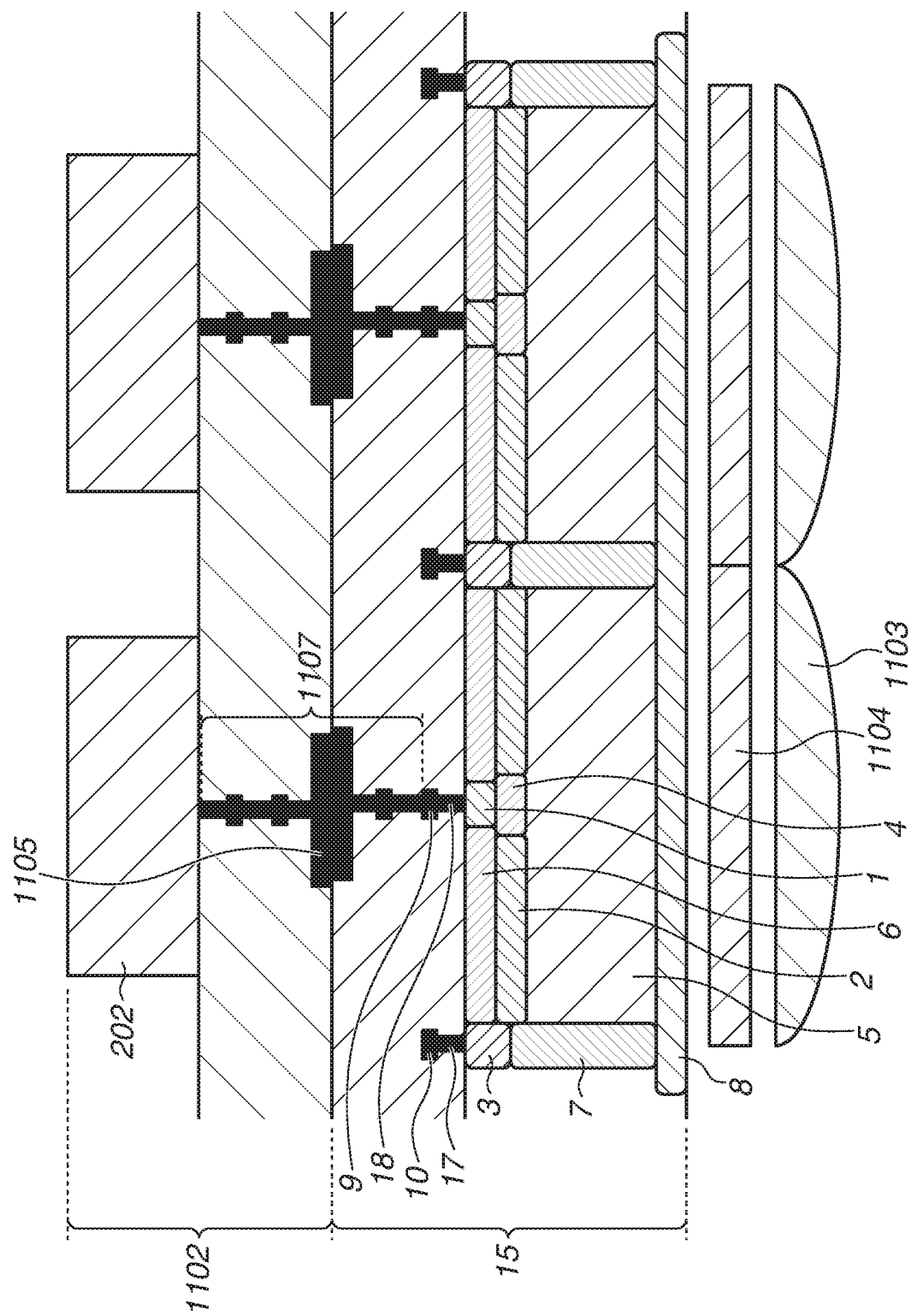
FIG. 16 is a schematic sectional view of the avalanche diode.

FIG. 16 is a schematic sectional view of the avalanche diode and the control unit according to a sixth exemplary embodiment. Similar reference signs are attached to units having similar functions in FIGS. 1 to 15B and a detailed description thereof is omitted.

In FIG. 16, the photoelectric conversion unit 201 and the control unit 202 are arranged on different semiconductor substrates. The configuration of the avalanche diode constituting the photoelectric conversion unit 201 is similar to that in the first exemplary embodiment. A plurality of units of the photoelectric conversion unit 201 is arranged on the semiconductor substrate 15. Here, as an example, a configuration in which two avalanche diodes are arranged is illustrated. The control unit 202 and a conductive line 1107 connected to the control unit 202 are arranged on a semiconductor substrate 1102. Here, a configuration in which the control unit 202 and the conductive line 1107 are arranged on the semiconductor substrate 1102 is illustrated, but other circuits may also be arranged.

The avalanche diode according to the present exemplary embodiment is configured as a back-side illumination type. Light enters in the direction from the N-type semiconductor region 5 toward the N-type semiconductor region 1. In this case, light enters the N-type semiconductor region 5 by passing through a microlens 1103 and a color filter 1104.

As described above, photoelectric conversion occurs in the N-type semiconductor region 5 and a generated electric charge moves to the N-type semiconductor region 1 by passing through the N-type semiconductor region 4. Avalanche amplification is caused by an electric field between the N-type semiconductor region 1 and a depletion layer generated between the P-type semiconductor region 2 and the N-type semiconductor region 4 so that a current flows to the conductive line 9.

The conductive line 9 is connected to the control unit 202 provided on the semiconductor substrate 1102 created separately via a connecting portion 1105.

A signal detected for each avalanche diode is processed by a scanning circuit or the like provided in the periphery of a pixel region of the semiconductor substrate 1102. Incidentally, the scanning circuit may also be arranged on a semiconductor substrate different from the semiconductor substrate 15 and the semiconductor substrate 1102.

According to the configuration in the present exemplary embodiment, the semiconductor substrate 1102 different from the semiconductor substrate 15 on which an avalanche diode is arranged is stacked thereon. Then, by arranging a processing circuit such as the control unit 202 on the semiconductor substrate 1102 that has been stacked, photo-detection efficiency can be improved by increasing the aperture ratio of the avalanche diode.

When the microlens 1103 is arranged on each avalanche diode in the present exemplary embodiment, a positional relationship such that the optical axis of the microlens 1103 is included in the N-type semiconductor region 4 in plane view is adopted. If, for example, vertical light enters a center area of the photoelectric conversion element 101, the distribution of generation probability of a signal charge inside the N-type semiconductor region 5 is maximal near the optical axis of the microlens 1103. Here, the optical axis of the microlens 1103 is an axis passing through the center of the microlens 1103 in plane view and perpendicular to the semiconductor substrate 15.

According to the configuration in the present exemplary embodiment, if the optical axis of the microlens 1103 is included in the N-type semiconductor region 4 two-dimensionally, an electric charge is more likely to be generated at a position of the N-type semiconductor region 5 closer to the N-type semiconductor region 4 in plane view. Then, the generation probability of an electric charge generated at a two-dimensionally farther position can be reduced so that deterioration of the time resolution until an electric charge is detected in the photo-detection region can be suppressed by an electric charge generated at a shallow position from the first surface of the semiconductor substrate 15 and an electric charge generated at a deep position thereof.

In the present exemplary embodiment, a photodiode of back-side illumination type is configured, but the front-side illumination type can also achieve effects according to the present exemplary embodiment, that is, high photo-detection efficiency and low direct current resistance (DCR) at the same time. However, in the present exemplary embodiment, because the photoelectric conversion unit is configured to be formed on the back side, the back-side illumination type can detect an electric charge generated near the uppermost surface (the side of light incidence) of the substrate more efficiently than the front-side illumination type. That is, from the viewpoint of being able to implement high photo-detection efficiency in a board wavelength range from short wavelengths to long wavelengths, the back-side illumination type is adopted for the photoelectric conversion unit 201 in the present exemplary embodiment.

The present exemplary embodiment can be applied to all exemplary embodiments.

In a seventh exemplary embodiment, an example of the photo-detection system using the photo-detection apparatus 1010 according to each exemplary embodiment will be described. An invisible light detection system as an example of the photo-detection system and a medical diagnostic system such as positron-emission tomography (PET) will be described with reference to FIG. 17. Similar reference signs are attached to units having similar functions in FIGS. 1 to 16 and a detailed description thereof is omitted. Incidentally, the pixel 100 according to the present exemplary embodiment includes a TDC and a memory instead of the counter circuit 209 in FIG. 5. Here, a description is provided assuming that the TDC is a TDC 204 and the memory is a memory 205.

Figure 17:
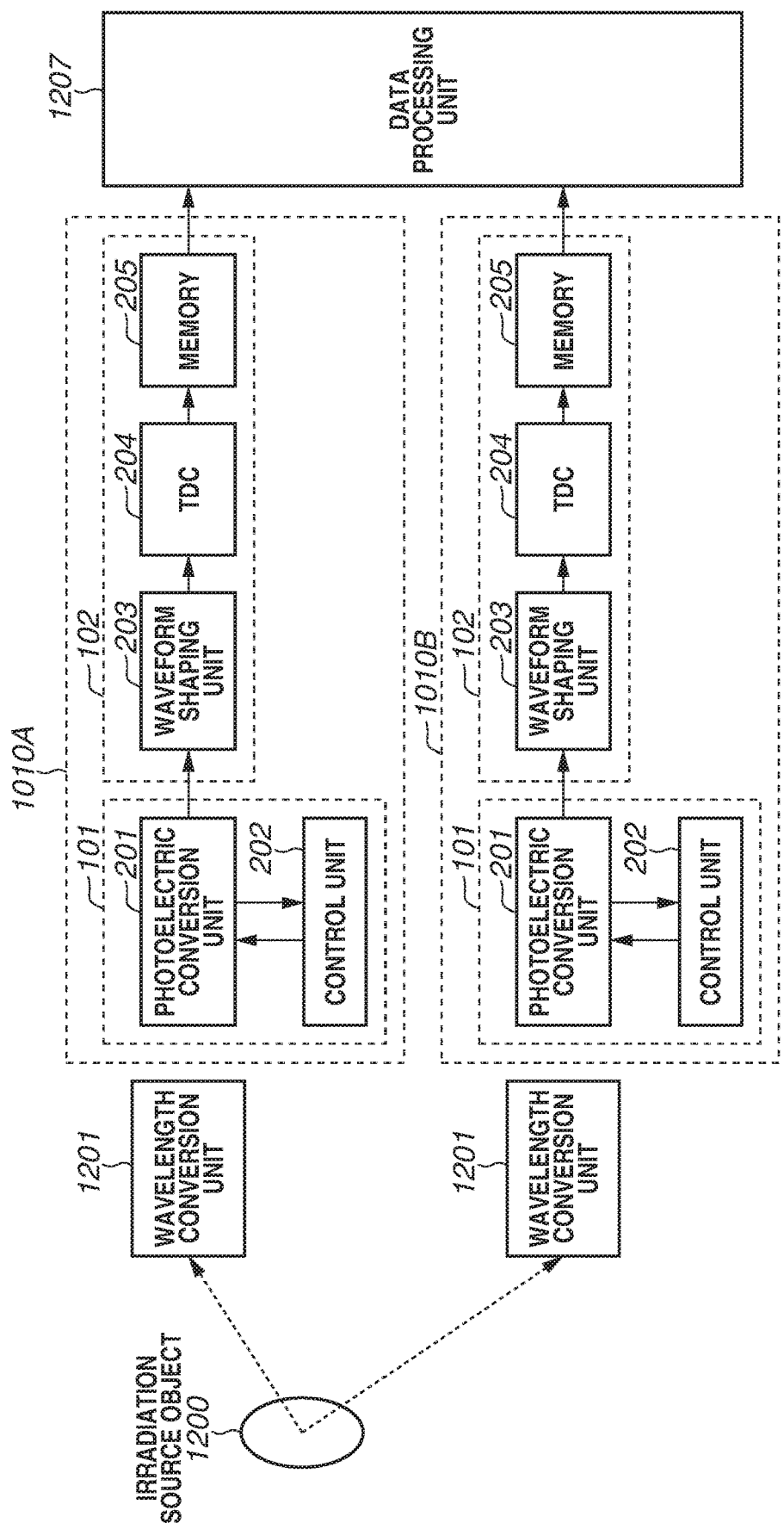
FIG. 17 is a block diagram of a photo-detection system.

FIG. 17 is a block diagram illustrating the configuration of an invisible light detection system. The invisible light detection system includes a wavelength conversion unit 1201 and a data processing unit 1207 and a plurality of the photo-detection apparatuses 1010.

An irradiation source object 1200 emits light of the wavelength range to be invisible light. The wavelength conversion unit 1201 receives light of the wavelength range to be invisible light emitted from the irradiation source object 1200 and emits visible light.

The photoelectric conversion unit 201 that visible light emitted from the wavelength conversion unit 1201 has entered performs photoelectric conversion and the photo-detection apparatuses 1010 holds a digital signal based on a signal based on a photoelectrically converted electric charge in the memory 205 via the control unit 202, the waveform shaping unit 203, and the TDC 204. The plurality of photo-detection apparatuses 1010 may be formed as one apparatus or a plurality of apparatuses being arranged.

A plurality of digital signals of the plurality of photo-detection apparatuses 1010 held in the memory 205 is signal-processed by the data processing unit 1207. Here, as a signal processing unit, a combination process of a plurality of images obtained from the plurality of digital signals is performed.

Next, as a concrete example of the invisible light detection system, the configuration of a medical diagnostic system such as PET will be described.

An object as the irradiation source object 1200 emits a radiation pair from inside the body. The wavelength conversion unit 1201 constitutes a scintillator and the scintillator emits visible light when a radiation pair emitted from the object enters.

The photoelectric conversion unit 201 visible light emitted from the scintillator has entered performs photoelectric conversion and the photo-detection apparatuses 1010 holds a digital signal based on a signal based on a photoelectrically converted electric charge in the memory 205 via the control unit 202, the waveform shaping unit 203, and the TDC 204. That is, the photo-detection apparatus 1010 is arranged to detect the arrival time of a radiation pair emitted from the object and detects visible light emitted from the scintillator and holds a digital signal in the memory 205.

Digital signals of the plurality of photo-detection apparatuses 1010 held in the memory 205 is signal-processed by the data processing unit 1207. Here, as a signal processing unit, a combination process such as an image reconfiguration is performed using a plurality of images obtained from the plurality of digital signals to form an image inside the body of the object.

In an eighth exemplary embodiment, an example of the photo-detection system using the photo-detection apparatus 1010 according to each exemplary embodiment will be described. Similar reference signs are attached to units having similar functions in FIGS. 1 to 16 and a detailed description thereof is omitted.

Figure 18:
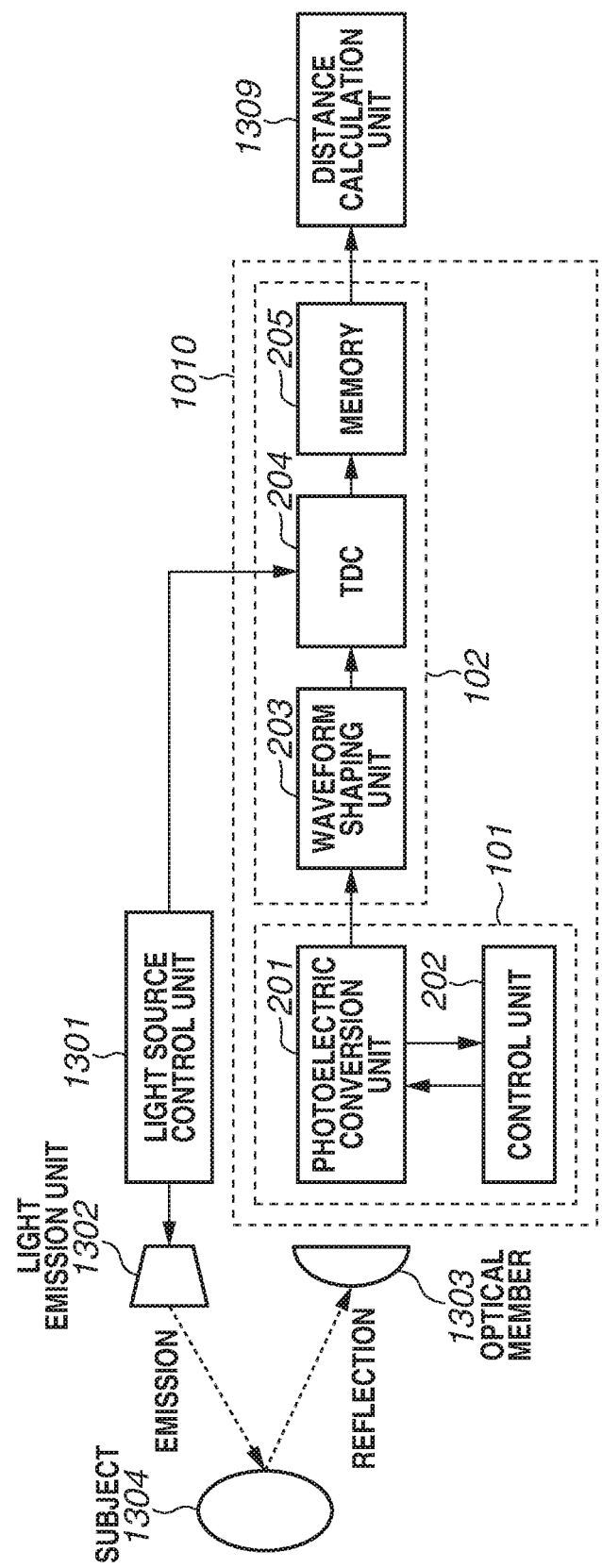
FIG. 18 is a block diagram of the photo-detection system.

A distance detection system as an example of the photo-detection system will be described in FIG. 18. Incidentally, the pixel 100 according to the present exemplary embodiment includes a TDC and a memory instead of the counter circuit 209 in FIG. 5. Here, a description is provided assuming that the TDC is the TDC 204 and the memory is the memory 205.

An example of the block diagram of the distance detection system according to the present exemplary embodiment will be described with reference to FIG. 18. The distance detection system includes a light source control unit 1301, a light emission unit 1302, an optical member 1303, the photo-detection apparatus 1010, and a distance calculation unit 1309.

The light source control unit 1301 controls driving of the light emission unit 1302. The light emission unit 1302 emits light of a short pulse (train) in the photographing direction when a signal is received from the light source control unit 1301.

The light emitted from the light emission unit 1302 is reflected by a subject 1304. The reflected light is received by the photoelectric conversion unit 201 of the photo-detection apparatus 1010 through the optical member 1303 and a signal based on a photoelectrically converted electric charge is input into the TDC 204 via the waveform shaping unit 203.

The TDC 204 compares a signal obtained from the light source control unit 1301 and a signal input from the waveform shaping unit 203. Then, the TDC 204 digitally converts the time from emission of pulse light from the light emission unit 1302 to reception of reflected light reflected by the subject 1304 with high precision. A digital signal output from the TDC 204 is held in the memory 205.

The distance calculation unit 1309 calculates the distance from the photo-detection apparatus 1010 to the subject 1304 based on digital signals from a plurality of measurements held in the memory 205. The distance detection system can be applied as, for example, an on-vehicle system.

Figure 19A:
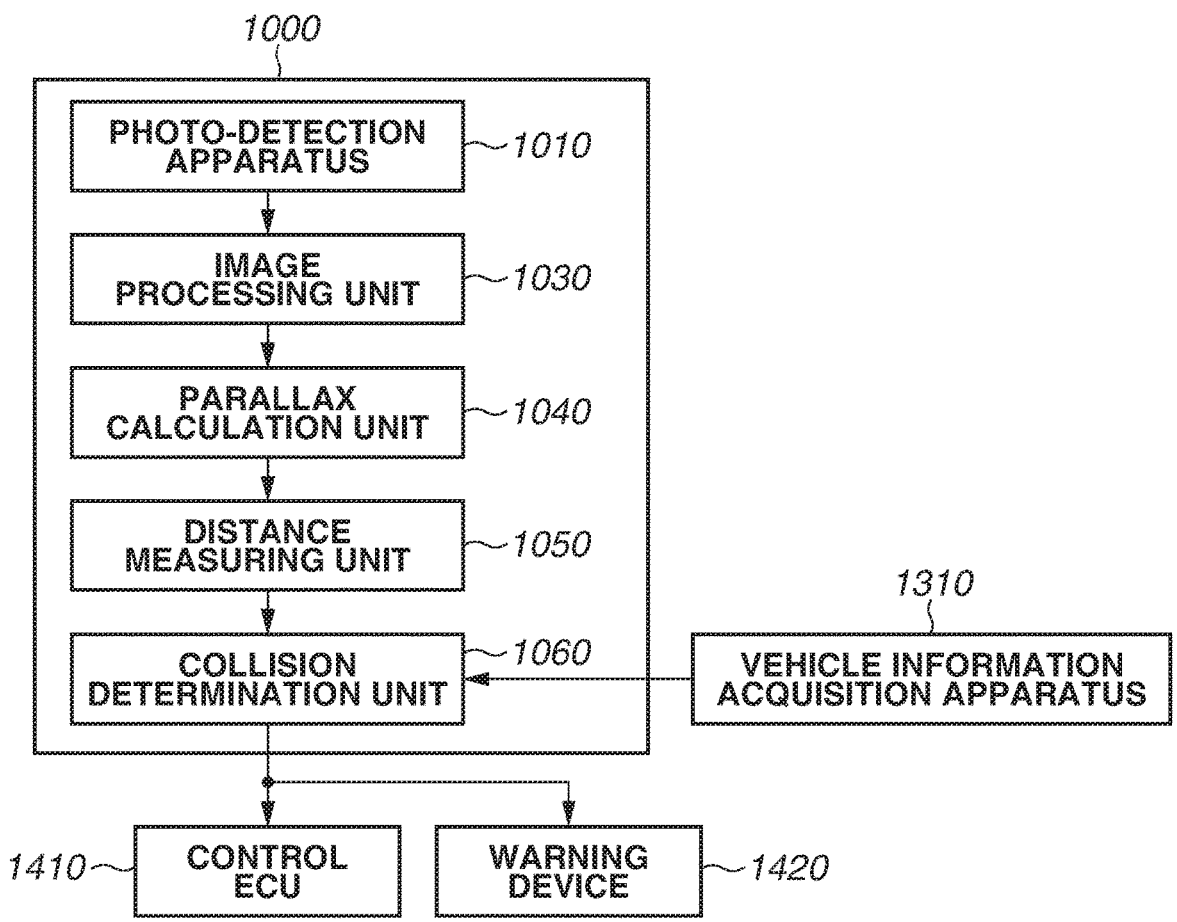
FIGS. 19A and 19B are block diagrams of the photo-detection system.
Figure 19B:
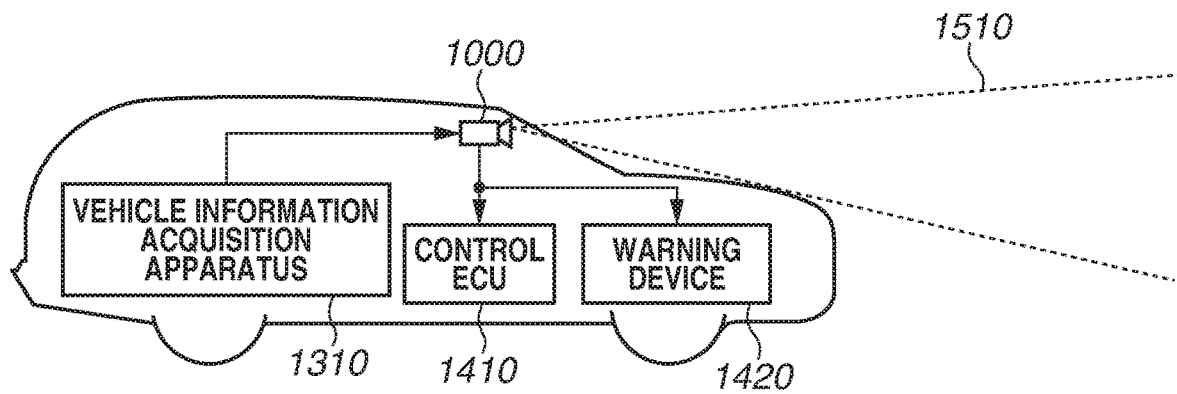

Next, an example of the photo-detection system when the counter circuit 209 in FIG. 5 is illustrated in FIGS. 19A and 19B. In FIGS. 19A and 19B, the photo-detection system related to an on-vehicle camera as an example of the photo-detection system is illustrated.

A photo-detection system 1000 is a photo-detection system including a focusing pixel and an imaging pixel according to the disclosure. The photo-detection system 1000 includes an image processing unit 1030 that performs image processing on a plurality of digital signals acquired by the photo-detection apparatus 1010. Further, the photo-detection system 1000 includes a parallax calculation unit 1040 that calculates a parallax (phase difference between parallactic images) from a plurality of pieces of image data acquired by the image processing unit 1030.

The photo-detection system 1000 also includes a distance measuring unit 1050 that calculates the distance to a target object based on a calculated parallax and a collision determination unit 1060 that determines whether a collision may occur based on a calculated distance. Here, the parallax calculation unit 1040 and the distance measuring unit 1050 are examples of a distance information acquisition unit that acquires distance information to a target object. That is, the distance information is information about the parallax, defocus amount, distance to a target object and the like.

The collision determination unit 1060 may determine the collision possibility using any piece of the above information. The distance information acquisition unit may be implemented by hardware designed specially, a software module, or a combination thereof. The distance information acquisition unit may also be implemented by a field programmable gate array (FPGA) or an application specific integrated circuit (ASIC) or further, a combination thereof.

The photo-detection system 1000 is connected to a vehicle information acquisition apparatus 1310 and can acquire vehicle information such as the vehicle speed, yaw rate, rudder angle and the like. The photo-detection system 1000 is also connected to a control electronic control unit (ECU) 1410 as a control apparatus to output a control signal that causes a vehicle to generate a braking force based on a determination result by the collision determination unit 1060.

The photo-detection system 1000 is also connected to a warning device 1420 that issues a warning to the driver based on a determination result by the collision determination unit 1060. If, for example, the collision possibility is high as a determination result by the collision determination unit 1060, the control ECU 1410 exercises vehicle control that avoids a collision by applying the brake, releasing the accelerator, or controlling engine output to mitigate damage. The warning device 1420 issues a warning by causing an alarm such as sound, displaying warning information on the screen of a car navigation system or the like, or generating vibrations in a seat belt or steering.

In the present exemplary embodiment, surroundings, for example, the front or the rear of a vehicle are imaged by the photo-detection system 1000. In FIG. 19B, the photo-detection system is illustrated when the front of a vehicle is imaged. The control that prevents a collision with other vehicles is described above, but the present exemplary embodiment can also be applied to control of auto-driving by following another vehicle or control of auto-driving by preventing the vehicle from deviating from the lane. Further, the photo-detection system 1000 can be applied not only to vehicles such as a local vehicle, but also to moving bodies (moving apparatuses), for example, ships, airplanes, or industrial robots. In addition to moving bodies, the photo-detection system 1000 can also be applied to devices widely using object recognition such as Intelligent Transport Systems (ITS).

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Applications No. 2016-202052, filed Oct. 13, 2016, and No. 2017-146724, filed Jul. 28, 2017, which are hereby incorporated by reference herein in their entirety.

What is claimed is:

1. A photodetection apparatus comprising:
    a substrate having a first surface and a second surface opposite to the first surface;
    a first semiconductor region of a first conductivity type including a majority carrier of a polarity of a signal charge, the first semiconductor region being arranged in a first depth of the substrate; and
    a second semiconductor region of a second conductivity type having different conductivity from the first conductivity type, the second semiconductor region being arranged in a second depth greater than the first depth from the first surface;
    a third semiconductor region of the first conductivity type, the third semiconductor region overlapped with the first semiconductor region in a plan view and being arranged in a third depth greater than the second depth from the first surface;
    a fourth semiconductor region of the second conductivity type, the fourth semiconductor region overlapped with the third semiconductor region in the plan view and being arranged in a fourth depth greater than the third depth from the first surface; and
    a fifth semiconductor region of the second conductivity type,
    wherein,
    in a cross section passing through the first semiconductor region, the second semiconductor region, the third semiconductor region, and the fourth semiconductor region, the fifth semiconductor region is arranged in one end side of the first semiconductor region and the other end side of the first semiconductor region,
    the fifth semiconductor region is formed from the first depth to the third depth, and
    in the second depth, a sixth semiconductor region is arranged in a region overlapping the first semiconductor region in the plan view, the sixth semiconductor region being a semiconductor region of the second conductivity type having an impurity concentration lower than that of the second semiconductor region or being a semiconductor region of the first conductivity type.

2. The apparatus according to claim 1, wherein a contact plug connected to the fifth semiconductor region is arranged at the first surface.

3. The apparatus according to claim 2, wherein a contact plug connected to the first semiconductor region is arranged at the first surface.

4. The apparatus according to claim 3, wherein the fifth semiconductor electrically connects the second semiconductor region and the fourth semiconductor region.

5. The apparatus according to claim 4, wherein avalanche amplification is generated between the first semiconductor region and the sixth semiconductor region.

6. A moving body comprising:
    the apparatus according to claim 5;
    a distance information acquisition unit configured to acquire distance information indicating a distance to a target object based on a signal from the photo-detection apparatus; and
    a control unit configured to control the moving body based on the distance information.

7. The apparatus according to claim 2, wherein the sixth semiconductor region is a semiconductor region of the second conductivity type having an impurity concentration lower than that of the second semiconductor region.

8. The apparatus according to claim 2, wherein the first semiconductor region is included in an avalanche diode.

9. The apparatus according to claim 8, wherein the first semiconductor region is surrounded by the fifth semiconductor region in the plan view.

10. The apparatus according to claim 9, further comprising a counter circuit which counts signal of the avalanche diode.

11. The apparatus according to claim 9, wherein in the cross section, one end side of the second semiconductor region is in contact with the fifth semiconductor region.

12. The apparatus according to claim 11, wherein in the cross section, the one end side of the first semiconductor region and the other end side of the first semiconductor region is in contact with the fifth semiconductor region.

13. The apparatus according to claim 12, wherein in the cross section, the first semiconductor region formed continuously in the first depth.

14. The apparatus according to claim 13, wherein a plurality of the first semiconductor regions are arranged in the substrate in a row direction and a column direction.

15. The apparatus according to claim 14, further comprising a microlens arranged so that light is incident on the first semiconductor region.

16. The apparatus according to claim 15,
wherein the electric charge of the first conductivity type is an electron.

17. A moving body comprising:
the apparatus according to claim 16;
a distance information acquisition unit configured to acquire distance information indicating a distance to a target object based on a signal from the photo-detection apparatus; and
a control unit configured to control the moving body based on the distance information.

18. A moving body comprising:
the apparatus according to claim 1;
a distance information acquisition unit configured to acquire distance information indicating a distance to a target object based on a signal from the photo-detection apparatus; and
a control unit configured to control the moving body based on the distance information.

19. The apparatus according to claim 1, wherein the fifth semiconductor region includes an isolation portion, and the isolation potion includes an insulation isolation portion.

20. The apparatus according to claim 19, wherein a contact plug connected to the first semiconductor region is arranged at the first surface.

21. The apparatus according to claim 20, wherein avalanche amplification is generated between the first semiconductor region and the sixth semiconductor region.

22. The apparatus according to claim 21, wherein the fifth semiconductor electrically connects the second semiconductor region and the fourth semiconductor region.

23. A moving body comprising:
the apparatus according to claim 22;
a distance information acquisition unit configured to acquire distance information indicating a distance to a target object based on a signal from the photo-detection apparatus; and
a control unit configured to control the moving body based on the distance information.

* * * * *